US012107095B2

(12) United States Patent
Okura et al.

(10) Patent No.: US 12,107,095 B2
(45) Date of Patent: Oct. 1, 2024

(54) SOLID-STATE IMAGING DEVICE, METHOD FOR FABRICATING SOLID-STATE IMAGING DEVICE, AND ELECTRONIC APPARATUS

(71) Applicants: BRILLNICS SINGAPORE PTE. LTD., Singapore (SG); Tohoku Techno Arch Co., Ltd., Miyagi (JP)

(72) Inventors: Shunsuke Okura, Tokyo (JP); Isao Takayanagi, Tokyo (JP); Kazuya Mori, Tokyo (JP); Ken Miyauchi, Tokyo (JP); Shigetoshi Sugawa, Miyagi (JP)

(73) Assignees: BRILLNICS SINGAPORE PTE. LTD., Singapore (SG); TOHOKU TECHNO ARCH CO., LTD., Miyagi (JP)

( * ) Notice: Subject to any disclaimer, the term of this patent is extended or adjusted under 35 U.S.C. 154(b) by 1476 days.

(21) Appl. No.: 16/514,298

(22) Filed: Jul. 17, 2019

(65) Prior Publication Data

US 2020/0027910 A1    Jan. 23, 2020

Related U.S. Application Data

(63) Continuation-in-part of application No. 16/509,440, filed on Jul. 11, 2019, now abandoned.

(30) Foreign Application Priority Data

Jul. 17, 2018    (JP) ................................. 2018-134131

(51) Int. Cl.
*H01L 27/146*    (2006.01)
(52) U.S. Cl.
CPC .... *H01L 27/14603* (2013.01); *H01L 27/1464* (2013.01); *H01L 27/14656* (2013.01); *H01L 27/14689* (2013.01)

(58) Field of Classification Search
CPC ......................................... H01L 27/146–14893
See application file for complete search history.

(56) References Cited

U.S. PATENT DOCUMENTS

2004/0251482 A1    12/2004 Rhodes
2006/0263975 A1    11/2006 Cheng et al.
(Continued)

FOREIGN PATENT DOCUMENTS

EP        1746820 A1    1/2007
JP     2005-223681 A    8/2005
JP        004317115 B2    8/2009

OTHER PUBLICATIONS

European Patent Office, European Search Report for EP Application No. 19186765.4, Jan. 8, 2020, pp. 1-10.

*Primary Examiner* — Eric A. Ward
*Assistant Examiner* — Nora T. Nix
(74) *Attorney, Agent, or Firm* — Pillsbury Winthrop Shaw Pittman LLP

(57) ABSTRACT

One object of the present invention is to provide a solid-state imaging device, a method for fabricating a solid-state imaging device, and an electronic apparatus that implement both a wide dynamic range and a high sensitivity. A storage capacitor serving as a storage capacitance element includes a first electrode and a second electrode on a second substrate surface side. The first electrode is formed of a p+ region (the second conductivity type semiconductor region) formed in the surface of a second substrate surface of a substrate, and the second electrode is formed above the second substrate surface so as to be opposed at a distance to the first electrode in the direction perpendicular to the substrate surface. The first electrode and the second electrode are arranged so as to spatially overlap with a photoelectric conversion part in the direction perpendicular to the substrate surface.

24 Claims, 21 Drawing Sheets

(56) References Cited

U.S. PATENT DOCUMENTS

| | | | |
|---|---|---|---|
| 2008/0266434 A1* | 10/2008 | Sugawa | H04N 23/741 348/308 |
| 2009/0039395 A1* | 2/2009 | Tachikawa | H01L 27/14812 257/E27.15 |
| 2009/0201400 A1* | 8/2009 | Zhang | H01L 27/14609 257/292 |
| 2012/0242875 A1 | 9/2012 | Nakamura | |
| 2014/0231879 A1* | 8/2014 | Meynants | H01L 27/14616 257/230 |
| 2016/0268220 A1 | 9/2016 | Tsai et al. | |

* cited by examiner

SOLID-STATE IMAGING DEVICE, METHOD FOR FABRICATING SOLID-STATE IMAGING DEVICE, AND ELECTRONIC APPARATUS

CROSS-REFERENCE TO RELATED APPLICATIONS

This application is based on and claims the benefit of priority from Japanese Patent Application Serial No. 2018-134131 (filed on Jul. 17, 2018), the contents of which are hereby incorporated by reference in their entirety.

TECHNICAL FIELD

The present invention relates to a solid-state imaging device, a method for fabricating a solid-state imaging device, and an electronic apparatus.

BACKGROUND

A solid-state imaging device (an image sensor) including photoelectric conversion elements for detecting light and generating a charge is embodied in CCD (charge coupled device) image sensors and CMOS (complementary metal oxide semiconductor) image sensors, which have been in practical use. The CCD image sensors and CMOS image sensors have been widely applied as parts of various electronic apparatuses such as digital cameras, video cameras, surveillance cameras, medical endoscopes, personal computers (PCs), and portable terminals (mobile devices) including mobile phones.

A CMOS image sensor includes, for each pixel, a photodiode (a photoelectric conversion element) and a floating diffusion (FD) amplifier having a floating diffusion (FD). The mainstream design of the reading operation in CMOS image sensors is a column parallel output processing performed by selecting a row in a pixel array and reading the pixels simultaneously in the column direction.

Each pixel of a CMOS image sensor includes, for one photodiode for example, four active elements: a transfer transistor serving as a transfer element, a reset transistor serving as a reset element, a source follower transistor serving as a source follower element (an amplification element), and a selection transistor serving as a selection element (see, for example, Japanese Patent Application Publication No. 2005-223681).

To improve characteristics, various methods have been proposed for fabricating a CMOS image sensor that has a wide dynamic range and provides a high picture quality (see, for example, Japanese Patent No. 4317115 ("the '115 patent")).

Such a wide dynamic range CMOS image sensor includes the four elements described above: a transfer transistor, a reset transistor, a source follower transistor, and a selection transistor, as well as the following elements: a storage capacitor (CS) for storing charges from a floating diffusion FD to which stored charges of a photodiode PD are transferred, and a storage transistor (a CS reading switch) for mixing the charges stored in the storage capacitor and the charges stored in the floating diffusion.

This CMOS image sensor implements a wide dynamic range by reading the charges stored in the floating diffusion before the mixing, and reading the mixed charges after the mixing.

Each pixel typically includes a photodiode (PD) configured as a pinned photodiode (PPD). On a substrate surface for forming the photodiodes (PD), there is a surface level due to dangling bonds or other defects, and therefore, a lot of charges (dark current) are generated due to heat energy, so that signals fail to be read out correctly. In a pinned photodiode (PPD), a charge storage part of the photodiode PD is pinned in the substrate to reduce mixing of the dark current into signals. The sensitivity of the photodiode (PD) can be changed by, for example, changing the exposure time.

A pinned photodiode (PPD) is made of, for example, an n-type semiconductor layer and a p-type semiconductor layer, and the p-type semiconductor layer is formed in the surface of the n-type semiconductor layer, that is, in the vicinity of an interface with an insulating film. The p-type semiconductor layer, which is in a shallow location, contains a high concentration of impurities and serves to inhibit the dark current.

As described above, the CMOS image sensor disclosed in the '115 patent, which includes a photodiode PD and a storage capacitor CS, is configured to retain signal charges in the storage capacitor CS that has a higher capacitance density than the photodiode PD, so as to increase the maximum signals and enlarge the dynamic range DR.

However, in the CMOS image sensor of the '115 patent, an enlarged capacitance of the storage capacitor CS results in a reduced photodiode PD fill factor that leads to a lower sensitivity. By contrast, an enlarged light receiving area of the photodiode PD results in reduction of the area occupied by the storage capacitor CS that leads to a reduced dynamic range.

SUMMARY

One object of the present invention is to provide a solid-state imaging device, a method for fabricating a solid-state imaging device, and an electronic apparatus that implement both a wide dynamic range and a high sensitivity.

A solid-state imaging device according to the first aspect of the present invention comprises: a substrate having a first substrate surface side and a second substrate surface side opposed to the first substrate surface side; a photoelectric conversion part including a first conductivity type semiconductor layer pinned between the first substrate surface side and the second substrate surface side of the substrate, the photoelectric conversion part being configured to perform photoelectric conversion of received light and store charges; a second conductivity type semiconductor layer formed at least on a side portion of the first conductivity type semiconductor layer of the photoelectric conversion part a transfer transistor for transferring the charges stored in the photoelectric conversion part a floating diffusion to which the charges are transferred through the transfer transistor; a storage transistor connected to the floating diffusion; and a storage capacitance element for storing the charges received from the floating diffusion via the storage transistor, wherein the storage capacitance element is formed on the second substrate surface side so as to spatially overlap with at least a part of the photoelectric conversion part in a direction perpendicular to a substrate surface.

A method for fabricating the solid-state imaging device according to the second aspect of the present invention comprises: forming, in a substrate having a first substrate surface side and a second substrate surface side opposed to the first substrate surface side, a photoelectric conversion part including a first conductivity type semiconductor layer pinned between the first substrate surface side and the second substrate surface side, the photoelectric conversion part being configured to perform photoelectric conversion of received light and store charges; forming a second conductivity type semiconductor layer at least on a side portion of the first conductivity type semiconductor layer of the photoelectric conversion part forming a transfer transistor for transferring the charges stored in the photoelectric conversion part forming a floating diffusion to which the charges are transferred through the transfer transistor; forming a storage transistor connected to the floating diffusion; and forming a storage capacitance element for storing the charges received from the floating diffusion via the storage transistor, wherein forming the storage capacitance element includes forming the storage capacitance element on the second substrate surface side so as to spatially overlap with at least a part of the photoelectric conversion part in a direction perpendicular to a substrate surface.

An electronic apparatus according to the third aspect of the present invention comprises: a solid-state imaging device; and an optical system for forming a subject image on the solid-state imaging device, wherein the solid-state imaging device includes: a substrate having a first substrate surface side and a second substrate surface side opposed to the first substrate surface side; a photoelectric conversion part including a first conductivity type semiconductor layer pinned between the first substrate surface side and the second substrate surface side of the substrate, the photoelectric conversion part being configured to perform photoelectric conversion of received light and store charges; a second conductivity type semiconductor layer formed at least on a side portion of the first conductivity type semiconductor layer of the photoelectric conversion part a transfer transistor for transferring the charges stored in the photoelectric conversion part a floating diffusion to which the charges are transferred through the transfer transistor; a storage transistor connected to the floating diffusion; and a storage capacitance element for storing the charges received from the floating diffusion via the storage transistor, and wherein the storage capacitance element is formed on the second substrate surface side so as to spatially overlap with at least a part of the photoelectric conversion part in a direction perpendicular to a substrate surface.

Advantages

The present invention implements both a wide dynamic range and a high sensitivity.

DESCRIPTION OF THE EMBODIMENTS

Embodiments of the present invention will be hereinafter described with reference to the drawings.

First Embodiment

Figure 1:
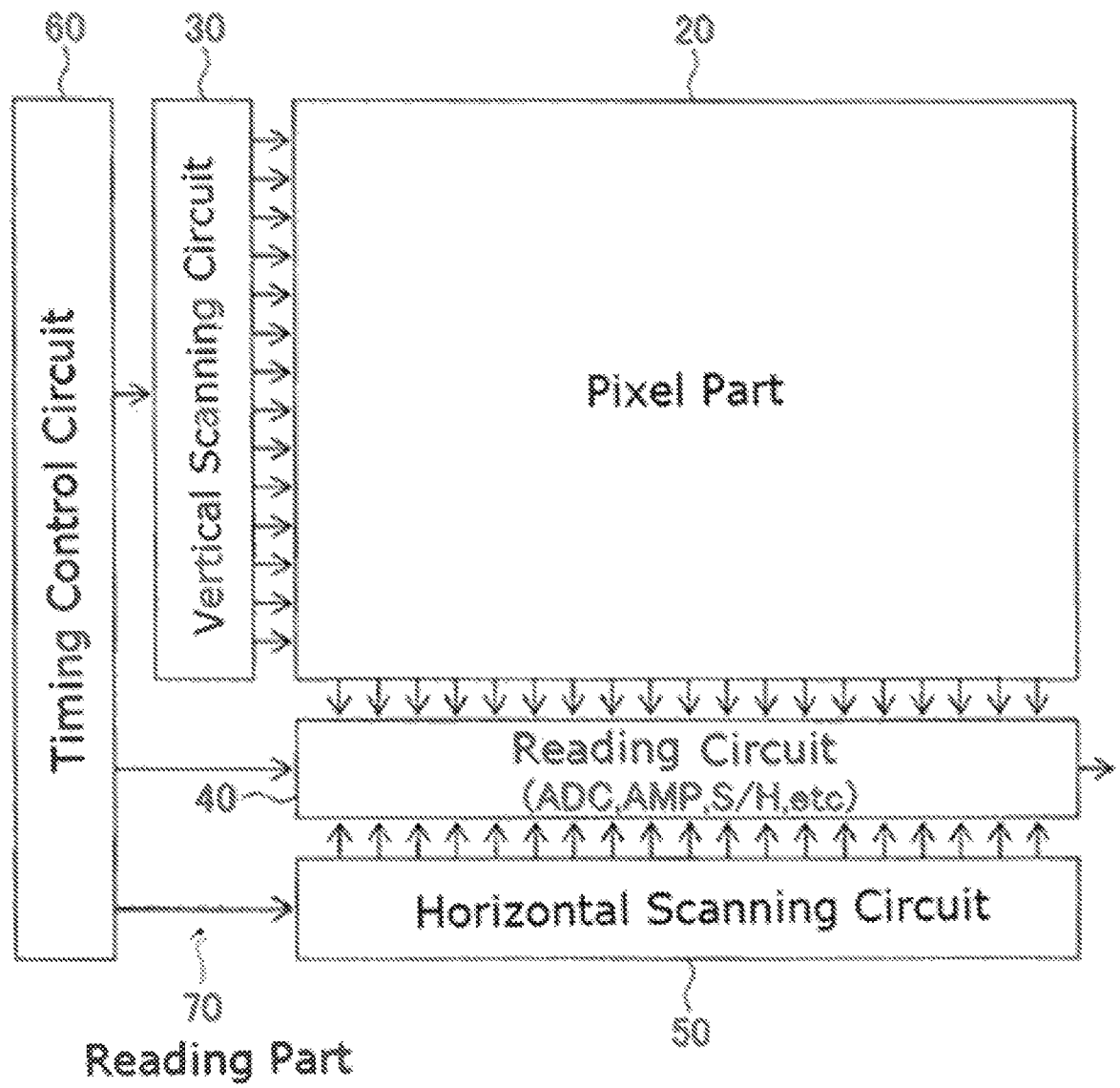
FIG. 1 is a block diagram showing a configuration of a solid-state imaging device according to a first embodiment of the present invention.

FIG. 1 is a block diagram showing an example configuration of a solid-state imaging device according to a first embodiment of the present invention. In this embodiment, the solid-state imaging device 10 is constituted by for example a backside illumination CMOS image sensor.

As shown in FIG. 1, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute the reading part 70 for reading out pixel signals.

In the first embodiment, the solid-state imaging device 10 includes pixels arranged in a matrix form in the pixel part 20 (or the pixel part 20), and the pixels PXL thereof each include a pinned photodiode (PPD) as a photoelectric conversion part, as will be described later.

The pixel PXL of the embodiment includes: a substrate which has a first substrate surface side (e.g., a back surface side) to be illuminated and a second substrate surface side (a front surface side) opposed to the first substrate surface side; a photoelectric conversion part (a photodiode PD1) which includes a first conductivity type (e.g., n-type in the embodiment) semiconductor layer (hereinafter also referred to as "the n layer") pinned between the first substrate surface side and the second substrate surface side of the substrate and is configured to perform photoelectric conversion of received light and store charges; and a second conductivity type (e.g., p-type in the embodiment) semiconductor layer (hereinafter also referred to as "the p layer") formed at least on a side portion of the first conductivity type semiconductor layer of the photoelectric conversion part. Further, the pixel PXL includes: a transfer transistor that transfers the charges stored in the photoelectric conversion part a floating diffusion FD1 to which the charges are transferred through the transfer transistor; and a storage transistor connected to the floating diffusion; and a storage capacitor CS1 serving as a storage capacitance element that stores the charges received from the floating diffusion FD1 via the storage transistor. In the pixel PXL, the storage capacitor CS1 serving as a storage capacitance element is formed on the second substrate surface side so as to spatially overlap with at least a part of the photoelectric conversion part in the direction perpendicular to the substrate surface.

In the first embodiment, the storage capacitor CS1 serving as a storage capacitance element includes a first electrode and a second electrode. The first electrode is formed of a second conductivity type (p-type) semiconductor region formed in the surface of the second substrate surface of the substrate, and the second electrode is formed above the second substrate surface so as to be opposed at a distance to the first electrode in the direction perpendicular to the substrate surface. The photoelectric conversion part includes a second conductivity type semiconductor region (a p+ region) formed on the surface of the first conductivity type semiconductor layer (the n layer) on the second substrate surface side. The second conductivity type semiconductor region contains a higher concentration of impurities than the second conductivity type semiconductor layer (the p layer) on the side portion of the first conductivity type semiconductor layer. Further, the storage capacitor CS1 serving as a storage capacitance element uses, as the first electrode thereof, the second conductivity type semiconductor region (the p+ region) formed on the surface on the second substrate surface side.

In the first embodiment, the substrate includes a first region and a second region arranged in the direction perpendicular to the substrate surface. The first region has a first depth from the second substrate surface toward the first substrate surface, and the second region has a second depth that is larger than the first depth. The second conductivity type semiconductor region (the p+ region) is formed on the surface of the first conductivity type semiconductor layer (the n layer) of the photoelectric conversion part in the first region, the surface being disposed on the second substrate surface side.

In the embodiment, the reading part 70 can perform first conversion gain mode reading and second conversion gain mode reading in a single reading period. In the first conversion gain mode reading, the reading part 70 reads pixel signals with a first conversion gain corresponding to a first capacitance, and in the second conversion gain mode reading, the reading part 70 reads pixel signals with a second conversion gain corresponding to a second capacitance (that is different from the first capacitance). That is, the solid-state imaging sensor 10 of the embodiment is a solid-state imaging element with a wide dynamic range that is configured to output both bright signals and dark signals by switching, in a single reading period, the interior of the pixels between a first conversion gain (e.g., a high conversion gain: HCG) mode and a second conversion gain (e.g., a low conversion gain: LCG) mode for outputting signals generated from the charges (electrons) produced by the photoelectric conversion in a single storage period (exposure period).

In a normal pixel reading operation, a shutter scan and then a reading scan are performed by driving of the pixels by the reading part 70. The first conversion gain mode reading (HCG) and the second conversion gain mode reading (LCG) are performed in the period of the reading scan.

A description will be hereinafter given of an outline of the configurations and functions of the parts of the solid-state imaging device 10 and then details of example configurations of the pixels PXL having a pinned photodiode (PPD) part.

<Configurations of Pixel Part 20 and Pixels PXL>

In the pixel part 20, a plurality of pixels each including a photodiode (a photoelectric conversion element) and an in-pixel amplifier are arranged in a two-dimensional matrix comprised of N rows and M columns.

Figure 2:
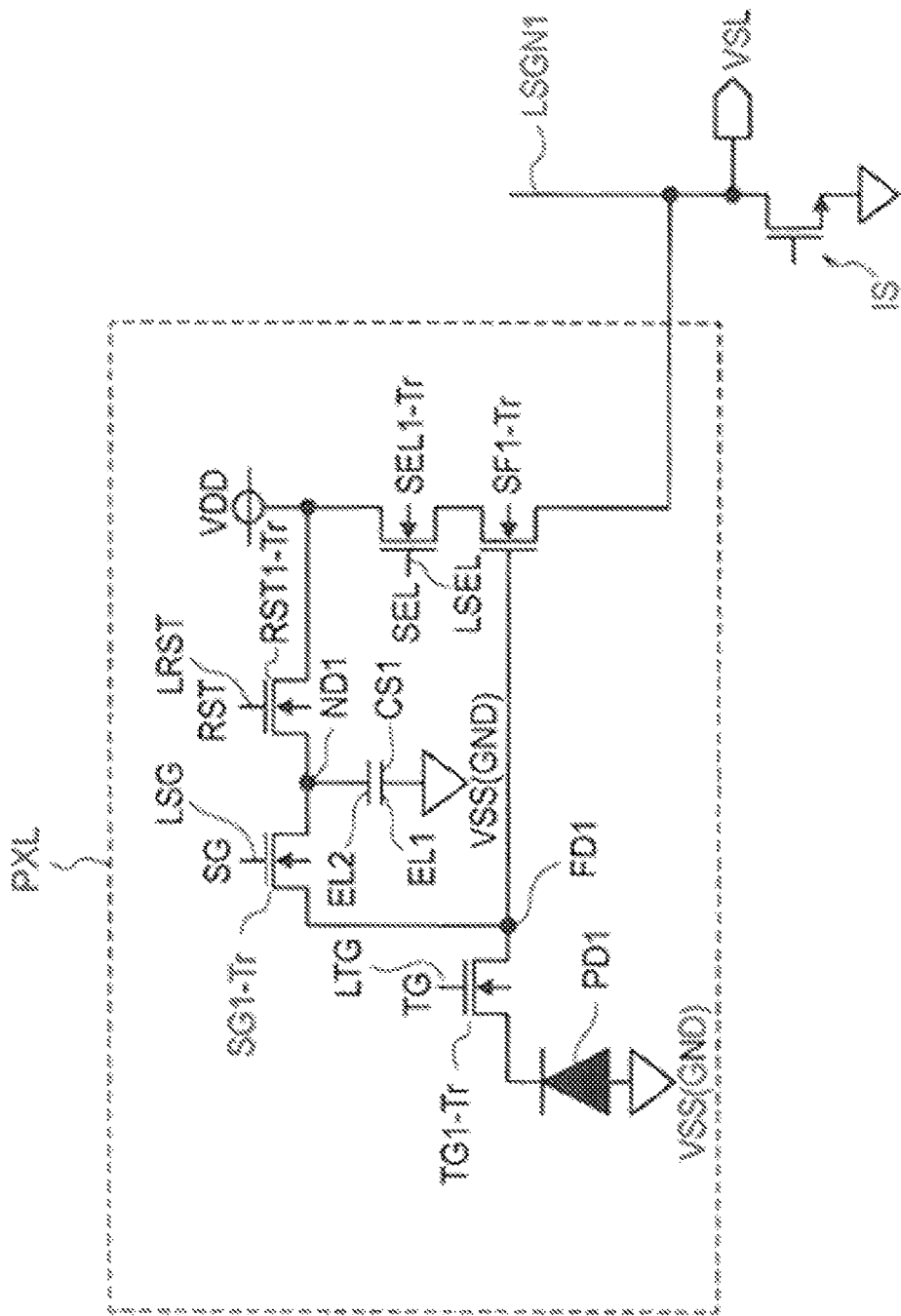
FIG. 2 is a circuit diagram showing an example of a pixel according to the first embodiment.

FIG. 2 is a circuit diagram showing an example of a pixel according to the embodiment.

The pixel PXL includes, for example, a photodiode PD1 serving as a photoelectric conversion part (a photoelectric conversion element). In association with the photodiode PD1, the pixel PXL includes one each of a transfer transistor TG1-Tr as a charge transfer gate part (a transfer element), a reset transistor RST1-Tr as a reset element, a source follower transistor SF1-Tr as a source follower element, a selection transistor SEL1-Tr as a selecting element, a storage transistor SG1-Tr as a storage element, and a storage capacitor CS1 as a storage capacitance element.

The photodiode PD generates signal charges (electrons) in an amount in accordance with the quantity of the incident light and stores the same. A description will be hereinafter given of a case where the signal charges are electrons and each transistor is an n-type transistor. However, it is also possible that the signal charges are holes or each transistor is a p-type transistor. Further, this embodiment is also applicable to the case where a plurality of photodiodes share the transistors or the case where the pixel includes four transistors (4Tr) other than the selection transistor.

The photodiode (PD) in each pixel PXL is a pinned photodiode (PPD). On a substrate surface for forming the photodiodes (PD), there is a surface level due to dangling bonds or other defects, and therefore, a lot of charges (dark current) are generated due to heat energy, so that signals fail to be read out correctly. In a pinned photodiode (PPD), a charge storage part of the photodiode (PD) is pinned in the substrate to reduce mixing of the dark current into signals.

The transfer transistor TG1-Tr is connected between the pinned photodiode (PPD) and a floating diffusion FD1 and controlled through a control signal TG. The transfer transistor TG1-Tr is selected and enters a conductive state in a period in which the control signal TG is at a high (H) level and transfers to the floating diffusion FD1 the charges (electrons) produced by photoelectric conversion and then stored in the photodiode PD1.

In the example shown in FIG. 2, the reset transistor RST1-Tr is connected between a power supply potential VDD and the storage transistor SG1-Tr connected to the floating diffusion FD1, and the reset transistor RST1-Tr is controlled through a control signal RST. The reset transistor RST1-Tr is selected and enters a conductive state in a period in which the control signal RST is at the H level and resets the floating diffusion FD1 to the power supply potential VDD when the storage transistor SG1-Tr is in a conductive state.

For example, the source of the storage transistor SG1-Tr is connected to the floating diffusion FD1. The storage capacitor CS1 is arranged such that the first electrode EL1 is connected to the reference potential VSS (e.g., the ground potential GND) and the second electrode EL2 is connected to the drain of the storage transistor SG1-Tr as a capacitance connection node ND1. The storage transistor SG1-Tr is controlled by the control signal SG applied to the gate thereof through the control line. The storage transistor SG1-Tr is selected and enters a conductive state in a period in which the control signal SG is at the H level and connects between the floating diffusion FD1 and the storage capacitor CS1.

The first conversion gain (the high conversion gain: HCG) signal reading process is performed while the storage transistor SG1-Tr is maintained at a non-conductive state, such that the charges of the floating diffusion FD1 are separated from the charges of the storage capacitor CS1. The second conversion gain (the low conversion gain: LCG) signal reading process is performed while the storage transistor SG1-Tr is maintained at a conductive state, such that the charges of the floating diffusion FD1 and the charges of the storage capacitor CS1 are shared (mixed).

In the example shown in FIG. 2, the storage transistor SG1-Tr is connected between the floating diffusion FD1 and the reset transistor RST1-Tr, and the storage capacitor CS1 is connected between the connection node of the storage transistor SG1-Tr and the reference potential VSS. This arrangement is not limitative. For example, the reset transistor RST1-Tr and the storage transistor SG1-Tr may be individually in direct connection to the floating diffusion FD1.

The source follower transistor SF1-Tr and the selection transistor SEL1-Tr are connected in series between the power supply potential VDD and a vertical signal line LSGN1 to which a current source IS is connected. The gate of the source follower transistor SF1-Tr is connected to the floating diffusion FD1, and the selection transistor SEL1-Tr is controlled through a control signal SEL. The selection transistor SEL1-Tr is selected and enters a conductive state in a period in which the control signal SEL is at the H level. Thus, the source follower transistor SF1-Tr outputs, to the vertical signal line LSGN1, a read-out signal VSL of a column output generated by converting the charges of the floating diffusion FD1 to a voltage signal with a gain corresponding to a quantity of the charges (the potential). These operations are performed in parallel for pixels in one row, because for example the gates of the transfer transistor TG1-Tr, the reset transistor RST1-Tr, the selection transistor SEL1-Tr, and the storage transistor SG1-Tr are connected to each other in the unit of row.

Since the pixel part 20 includes the pixels PXL arranged in N rows and M columns, there are N each of control lines LSEL, LRST, LTG, LSG and M vertical signal lines LSGN1. In FIG. 1, the control lines LSEL, LRST, LTG, LSG are represented as one row-scanning control line.

The vertical scanning circuit 30 drives the pixels in shutter rows and reading rows through the row-scanning control lines in accordance with the control of the timing control circuit 60. Further, the vertical scanning circuit 30 outputs, according to address signals, row selection signals for row addresses of the reading rows from which signals are read out and the shutter rows in which the charges stored in the photodiodes PD1 are reset.

The reading circuit 40 includes a plurality of column signal processing circuits (not shown) arranged corresponding to the column outputs of the pixel part 20, and the reading circuit 40 may be configured such that the plurality of column signal processing circuits can perform column parallel processing.

The reading circuit 40 may include a correlated double sampling (CDS) circuit, an analog-digital converter (ADC), an amplifier (AMP), a sample/hold (S/H) circuit, and the like.

Figure 3A:
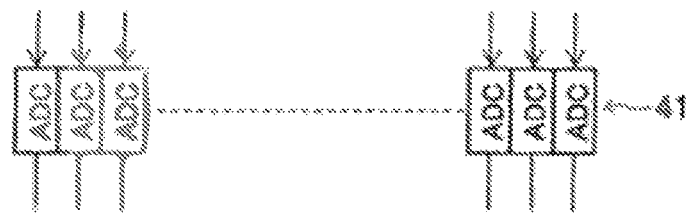
FIGS. 3A to 3C illustrate example configurations of a reading system of a column output from a pixel part of the solid-state imaging device according to the embodiment of the present invention.
Figure 3B:
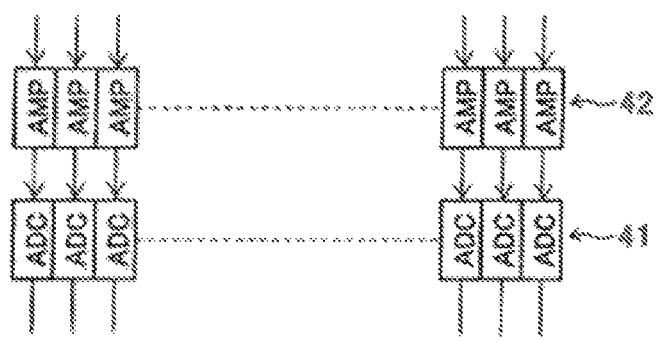
Figure 3C:
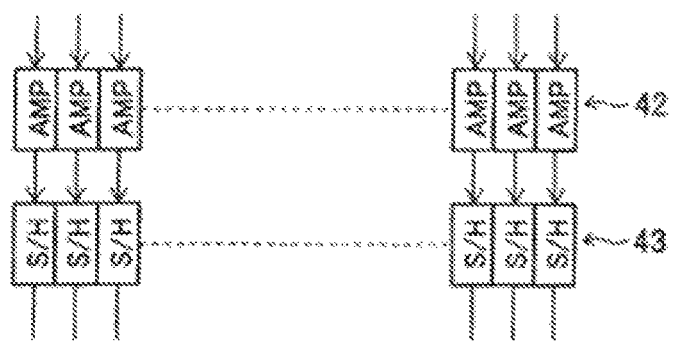

Thus, as shown in FIG. 3A for example, the reading circuit 40 may include ADCs 41 for converting the read-out signals VSL from the column outputs of the pixel part 20 into digital signals. Alternatively, as shown in FIG. 3B for example, the reading circuit 40 may include amplifiers (AMPs) 42 for amplifying the read-out signals VSL from the column outputs of the pixel part 20. It is also possible that, as shown in FIG. 3C for example, the reading circuit 40 may include sample/hold (S/H) circuits 43 for sampling/holding the read-out signals VSL from the column outputs of the pixel part 20.

The horizontal scanning circuit 50 scans the signals processed in the plurality of column signal processing circuits of the reading circuit 40 such as ADCs, transfers the signals in a horizontal direction, and outputs the signals to a signal processing circuit (not shown).

The timing control circuit 60 generates timing signals required for signal processing in the pixel part 20, the vertical scanning circuit 30, the reading circuit 40, the horizontal scanning circuit 50, and the like.

The above description outlined the configurations and functions of the parts of the solid-state imaging device 10. Next, a detailed description will be given of the configuration of the pixels according to the first embodiment.

<Specific Example of Pixel 200 (PXL)>

Figure 4:
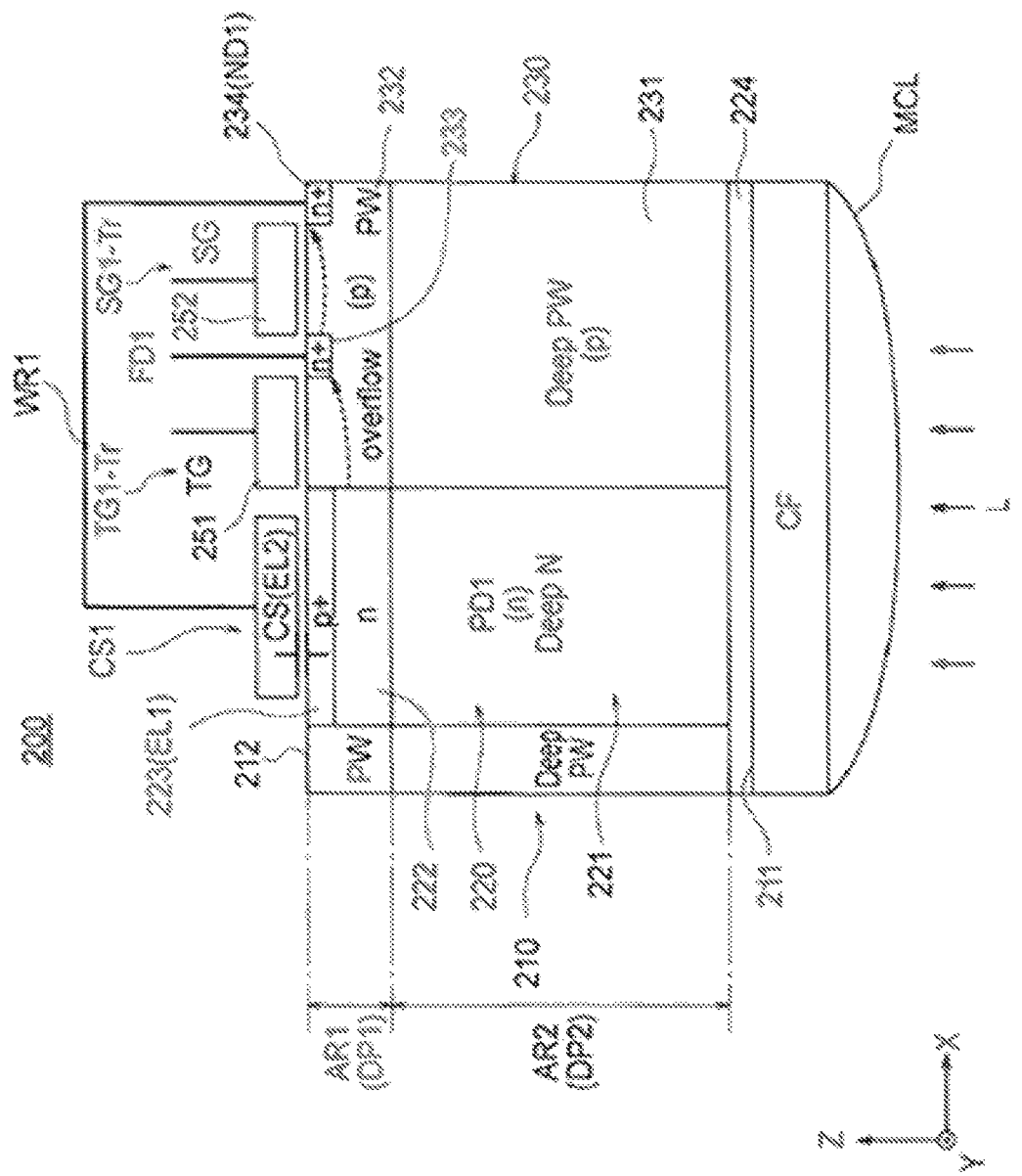
FIG. 4 is a simplified sectional view showing an example configuration of the pixel according to the first embodiment of the present invention.

FIG. 4 is a simplified sectional view showing an example configuration of the pixel according to the first embodiment of the present invention. The pixel described herein includes a pinned photodiode (PPD) and is denoted by a reference sign 200.

The pixel 200 shown in FIG. 4 includes a semiconductor substrate (hereinafter referred to simply as "the substrate") 210 having a first substrate surface 211 side (e.g., a back surface side) to be irradiated with light L and a second substrate surface 212 side (a front surface side) opposed to the first substrate surface side 211. The pixel 200 includes: a photoelectric conversion part as a photodiode PD1 which includes a first conductivity type (n-type in this embodiment) semiconductor layer (n layer) 221 pinned in the substrate 210 and is configured to perform photoelectric conversion of received light and store charges; and a second conductivity type (p-type in this embodiment) semiconductor layer 230 formed at least on a side portion of the n layer (the first conductivity type semiconductor layer) 221 of the photoelectric conversion part 220.

Further, the pixel 200 includes: a transfer transistor TG1-Tr that transfers the charges stored in the photoelectric conversion part 220; a floating diffusion FD1 to which the charges are transferred through the transfer transistor TG1-Tr; and a storage transistor SG1-Tr with the source connected to the floating diffusion FD1; and a storage capacitor CS1 serving as a storage capacitance element that stores the charges received from the floating diffusion FD1 via the drain side of the storage transistor SG1-Tr. In the pixel 200, the storage capacitor CS1 serving as a storage capacitance element is formed on the second substrate surface 212 side so as to spatially overlap with the photoelectric conversion part 220 in the direction perpendicular to the substrate surface (the direction Z in the orthogonal coordinate system shown).

In the first embodiment, the substrate 210 has a two-layer structure including a first region AR1 and a second region AR2 arranged in the direction perpendicular to the substrate surface (the direction Z in the orthogonal coordinate system shown). The first region AR1 has a first depth DP1 from the second substrate surface 212 toward the first substrate surface 211, and the second region AR2 has a second depth DP2 that is larger than the first depth DP1. In accordance with the two-layer structure, the photoelectric conversion part 220 and the p layer (the second conductivity type semiconductor layer) 230 shown in FIG. 4 each have a two-layer structure in the direction perpendicular to the substrate surface of the substrate 210 (the direction Z in the orthogonal coordinate system shown).

The photoelectric conversion part 220 has a two-layer structure including the n layer (the first conductivity type semiconductor layer) 221 in the second region AR2 and the n layer (the first conductivity type semiconductor layer) 222 in the first region AR1. The p layer (the second conductivity type semiconductor layer) 230 has a two-layer structure including the p layer (the second conductivity type semiconductor layer) 231 in the second region AR2 and the p layer (the second conductivity type semiconductor layer) 232 in the first region AR1.

Further, the photoelectric conversion part 220 includes a second conductivity type semiconductor region (a p+ region) 223 formed on the surface of the n layer (the first conductivity type semiconductor layer) 222 in the first region AR1 on the second substrate surface 212 side. The second conductivity type semiconductor region (the p+ region) 223 contains a higher concentration of impurities than the p layer (the second conductivity type semiconductor layer) 230 on the side portion of the n layer. Further, the storage capacitor CS1 serving as a storage capacitance element uses, as a first electrode EL1 thereof, the p+ region (the second conductivity type semiconductor region) 223 formed in the surface on the second substrate surface 212 side.

In the first embodiment, the storage capacitor CS1 serving as a storage capacitance element includes a first electrode EL1 and a second electrode EL2. The first electrode EL1 is formed of the p+ region (the second conductivity type semiconductor region) 223 formed in the surface of the second substrate surface 212 of the substrate 210, and the second electrode EL2 is formed above the second substrate surface 212 so as to be opposed at a distance to the first electrode EL1 in the direction perpendicular to the substrate surface.

In the first embodiment, a flat layer 224 is formed on the surfaces of the n layer (the first conductivity type semiconductor layer) 221 of the photoelectric conversion part 220 and the p layer (the second conductivity type semiconductor layer) 230 on the first substrate surface 211 side. A color filter part CF is formed on the light incidence side of the flat layer 224, and further, a microlens MCL is formed on the light incidence side of the color filter part so as to correspond to the photoelectric conversion part 220 as the photodiode PD1 and the p layer (the second conductivity type semiconductor layer) 230.

In the first embodiment, the p layer (the second conductivity type semiconductor layer) 232 in the first region AR1 contains the transfer transistor TG1-Tr, the floating diffusion FD1, and the storage transistor SG1-Tr.

The floating diffusion FD1 is formed in the surface of the second substrate surface 212 of the substrate 210, so as to constitute an n+ region (the first conductivity type semiconductor region) 233 containing a higher concentration of impurities than the n layer (the first conductivity type semiconductor layer) 221, 222 of the photoelectric conversion part 220.

The capacitance connection node ND1 of the storage transistor SG1-Tr for capacitance connection with the storage capacitor CS1 is formed in the surface of the second substrate surface 212 of the substrate 210, so as to constitute an n+ region (the first conductivity type semiconductor region) 234 containing a higher concentration of impurities than the n layers (the first conductivity type semiconductor layers) 221, 222 of the photoelectric conversion part 220. The n+ region 234 as the node ND1 is connected to the second electrode EL2 of the storage capacitor CS1 via a wiring layer WR1.

The transfer transistor TG1-Tr includes a gate electrode 251 disposed above the second substrate surface 212 of the substrate 210 between the p+ region (the second conductivity type semiconductor region) 223 and the n+ region (the first conductivity type semiconductor region) 233 as the floating diffusion FD1.

The storage transistor SG1-Tr includes a gate electrode 252 disposed above the second substrate surface 212 of the substrate 210 between the n+ region (the first conductivity type semiconductor region) 233 as the floating diffusion FD1 and the n+ region (the first conductivity type semiconductor region) 234 as the capacitance connection node ND1.

As described above, in the pixel 200 of the first embodiment, the storage capacitor CS1 serving as a storage capacitance element includes the first electrode EL1 and the second electrode EL2 on the second substrate surface 212 side. The first electrode EL1 is formed of the p+ region (the second conductivity type semiconductor region) 223 formed in the surface of the second substrate surface 212 of the substrate 210, and the second electrode EL2 is formed above the second substrate surface 212 so as to be opposed at a distance to the first electrode EL1 in the direction perpendicular to the substrate surface. The first electrode EL1 and the second electrode EL2 are arranged so as to spatially overlap with the photoelectric conversion part 220 in the direction perpendicular to the substrate surface (the direction Z in the orthogonal coordinate system shown). Accordingly, it can be prevented that an enlarged capacitance of the storage capacitor CS1 results in a reduced photodiode PD fill factor that leads to a lower sensitivity. In addition, it can be prevented that an enlarged light receiving area of the photodiode PD1 results in reduction of the area occupied by the storage capacitor CS1 that leads to a reduced dynamic range. As described above, the first embodiment implements both a wide dynamic range and a high sensitivity.

Second Embodiment

Figure 5:
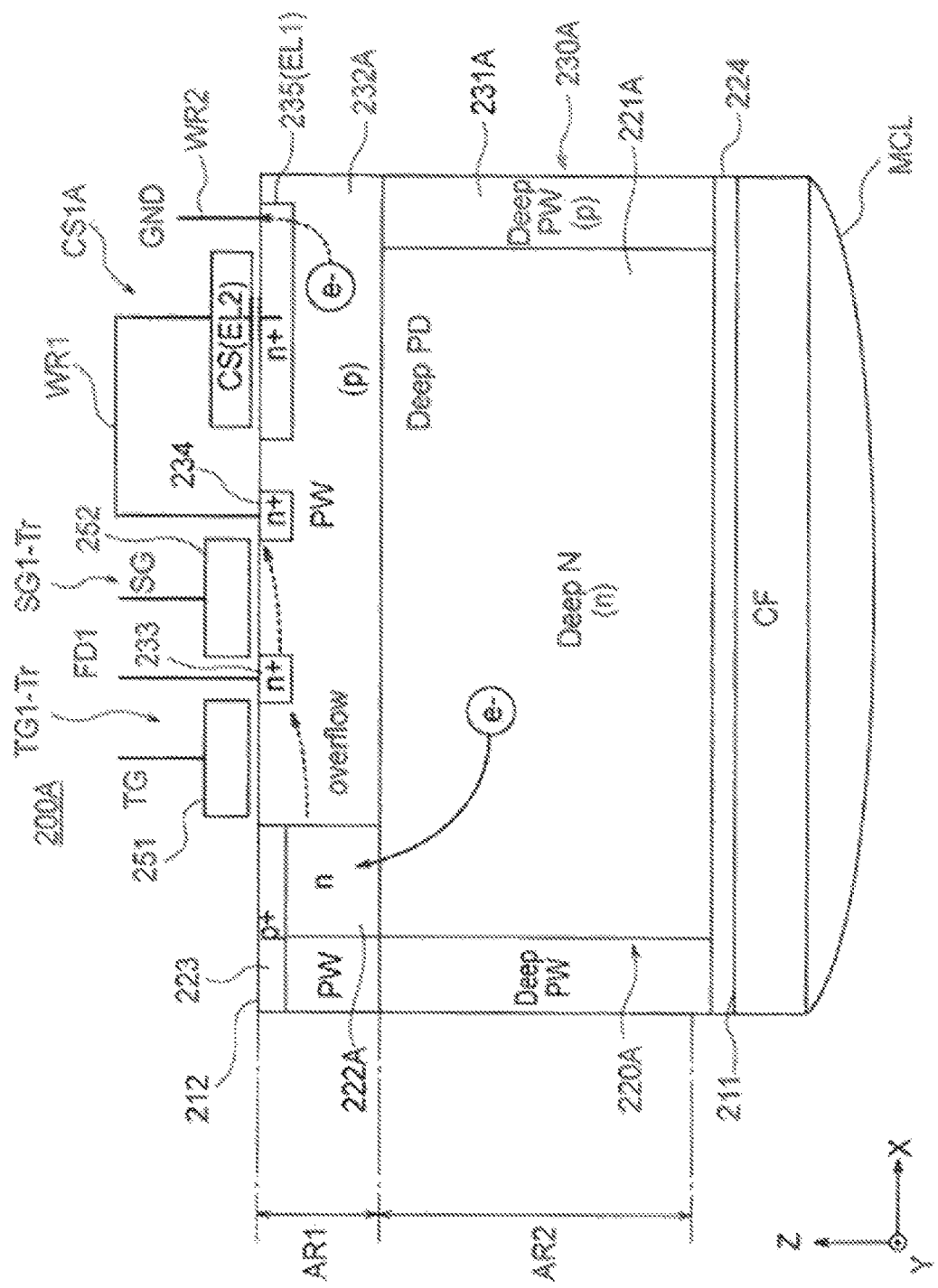
FIG. 5 is a simplified sectional view showing an example configuration of the pixel according to the second embodiment of the present invention.
Figure 6A:
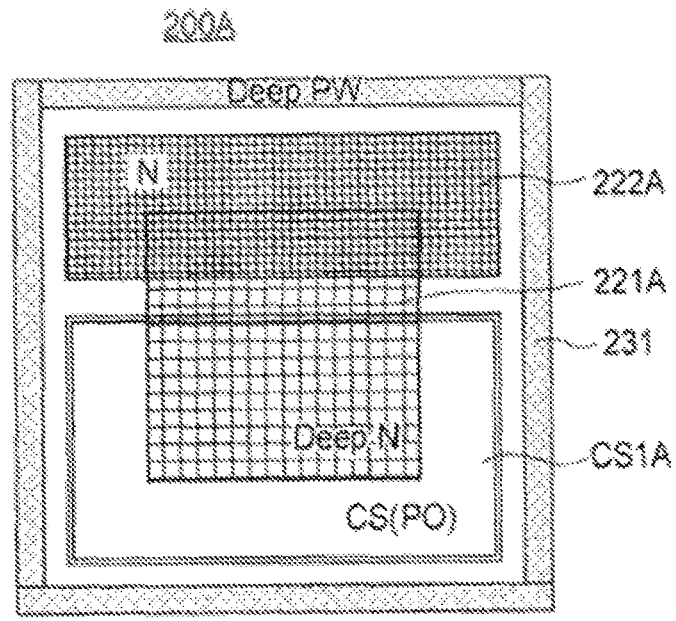
FIGS. 6A and 6B are plan views showing an example configuration of the pixel according to the second embodiment of the present invention.
Figure 6B:
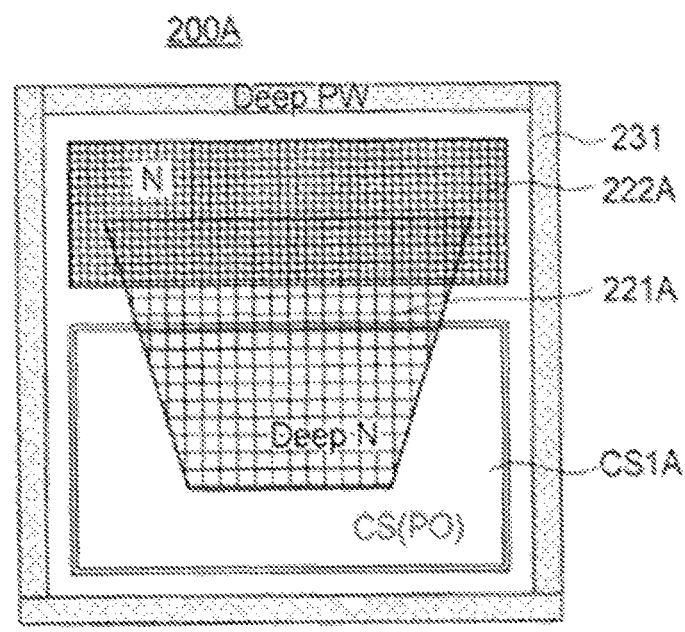

FIG. 5 is a simplified sectional view showing an example configuration of the pixel according to the second embodiment of the present invention. FIGS. 6A and 6B are plan views showing an example configuration of the pixel according to the second embodiment of the present invention.

The pixel 200A of the second embodiment differs from the pixel 200 of the first embodiment (shown in FIG. 4) in the following points.

In the pixel 200 of the first embodiment, the storage capacitor CS1 serving as a storage capacitance element includes the first electrode EL1 and the second electrode EL2 on the second substrate surface 212 side. The first electrode EL1 is formed of the p+ region (the second conductivity type semiconductor region) 223 formed in the surface of the second substrate surface 212 of the substrate 210, and the second electrode EL2 is formed above the second substrate surface 212 so as to be opposed at a distance to the first electrode EL1 in the direction perpendicular to the substrate surface. The first electrode EL1 and the second electrode EL2 are arranged so as to spatially overlap with the photoelectric conversion part 220 in the direction perpendicular to the substrate surface (the direction Z in the orthogonal coordinate system shown).

By contrast, in the pixel 200A of the second embodiment, the storage capacitor CS1A serving as a storage capacitance element, which is formed on the second substrate surface 212 side so as to spatially overlap with the photoelectric conversion part 220 in the direction perpendicular to the substrate surface (the direction Z in the orthogonal coordinate system shown), has the following configuration. The pixel 200A is formed such that the area of the portion of the n layer (the first conductivity type semiconductor layer) 221A in the second region AR2 opposed to the second substrate surface 212 is larger than the area of the portion of the n layer (the first conductivity type semiconductor layer) 222A in the first region AR1 opposed to the second substrate surface 212. In other words, in the pixel 200A, the n layer (the first conductivity type semiconductor layer) 221A in the second region AR2 extends in the direction X and the direction Y shown, and the n layer (the first conductivity type semiconductor layer) 222A in the first region AR1 is formed on an edge portion of the boundary region of the n layer (the first conductivity type semiconductor layer) 221A in the second region AR2.

Further, in the pixel 200A, the first electrode EL1 of the storage capacitor CS1A serving as the storage capacitance element is formed in the surface of the second substrate surface 212 of the substrate 210, so as to be opposed to the portion of the surface of the n layer (the first conductivity type semiconductor layer) 221A in the second region AR2 on which the n layer (the first conductivity type semiconductor layer) 222A is absent, with the p layer (the second conductivity type semiconductor layer) 232A in the first region AR1 interposed therebetween. The first electrode EL1 constitutes a n+ region (the first conductivity type semiconductor region) 235 containing a higher concentration of impurities than the n layers 221A, 222A of the photoelectric conversion part 220A. The second electrode EL2 of the storage capacitor CS1A is formed above the second substrate surface 212 so as to be opposed at a distance to the first electrode EL1 in the direction perpendicular to the substrate surface. As described above, the storage capacitor CS1A is formed as a MOS capacitance.

The first electrode EL1 is connected to the reference potential (the ground GND) through the wiring layer WR2.

In the pixel 200A configured as described above, the first electrode EL1 of the storage capacitor CS1A is formed as the n+ region (the first conductivity type semiconductor region) 235 having a high concentration of impurities, and therefore, the capacitance density and the linearity can be increased.

However, since the n layer (the first conductivity type semiconductor layer) 222A in the first region AR1 is not opposed to the storage capacitor CS1A, electrons produced from a part of the incident light having a long wavelength photoelectrically converted in a shallow region are discharged through the substrate-side ground GND of the storage capacitor CS1A, and therefore, the sensitivity for long wavelengths may be lowered. This lowering of the sensitivity can be avoided by use of a thicker substrate and deeper ion injection for n-type and p-type.

As shown in FIG. 5 and FIGS. 6A and 6B, the n layer (the first conductivity type semiconductor layer) 222A in the first region AR1 is offset from the center of the pixel, and therefore, it is possible to increase the area efficiency of the storage capacitor CS1A, produce a larger capacitor, and enlarge the dynamic range. The electrons produced by the photoelectric conversion in the n layer (the first conductivity type semiconductor layer) 221A in the second region AR2 are transferred to and stored in the n layer (the first conductivity type semiconductor layer) 222A in the first region AR1 by the potential gradient through an overlap region with the n layer (the first conductivity type semiconductor layer) 222A in the first region AR1.

Further, as shown in FIG. 5 and FIGS. 6A and 6B, in the pixel 200A, the region for the n layer (the first conductivity type semiconductor layer) 221A in the second region AR2 can be reduced in size such that the area occupied by this region approximates the small area occupied by the n layer (the first conductivity type semiconductor layer) 222A. This arrangement makes it possible that the peak voltage position of the photoelectric conversion part 220 as the photodiode PD1 is formed in the n layer (the first conductivity type semiconductor layer) 222A in the first region AR1 and a transfer residue (a residual image) of the stored charges (the signals) is reduced. For example, a large epitaxial (epi) region of p-type (the second conductivity type) may be intentionally left in the region allocated for forming the n layer (the first conductivity type semiconductor layer) 221A, so as to reduce the substantial region for the n layer (the first conductivity type semiconductor layer) 221A. The electrons produced by the photoelectric conversion in an epitaxial (epi) region between the n layer (the first conductivity type semiconductor layer) 221A in the second region AR2 and the p layer (the second conductivity type semiconductor layer) 231A in the second region AR2 are transferred to and stored in the n layer (the first conductivity type semiconductor layer) 222A in the first region AR1 by the potential gradient.

As shown in FIG. 6B, in the pixel 200A, the region for forming the n layer (the first conductivity type semiconductor layer) 221A in the second region AR2 may have such a shape that the electrons are readily transferred to the n layer (the first conductivity type semiconductor layer) 222A in the first region AR1, such as a trapezoidal shape or an L-shape, such that the electrons readily flow to the n layer (the first conductivity type semiconductor layer) 222A in the first region AR1. In the example shown in FIG. 6B, the n layer (the first conductivity type semiconductor layer) 221A in the second region AR2 has a trapezoidal shape in plan view, the trapezoidal shape being wider toward the n layer (the first conductivity type semiconductor layer) 222A to which the electrons are transferred.

Third Embodiment

Figure 7:
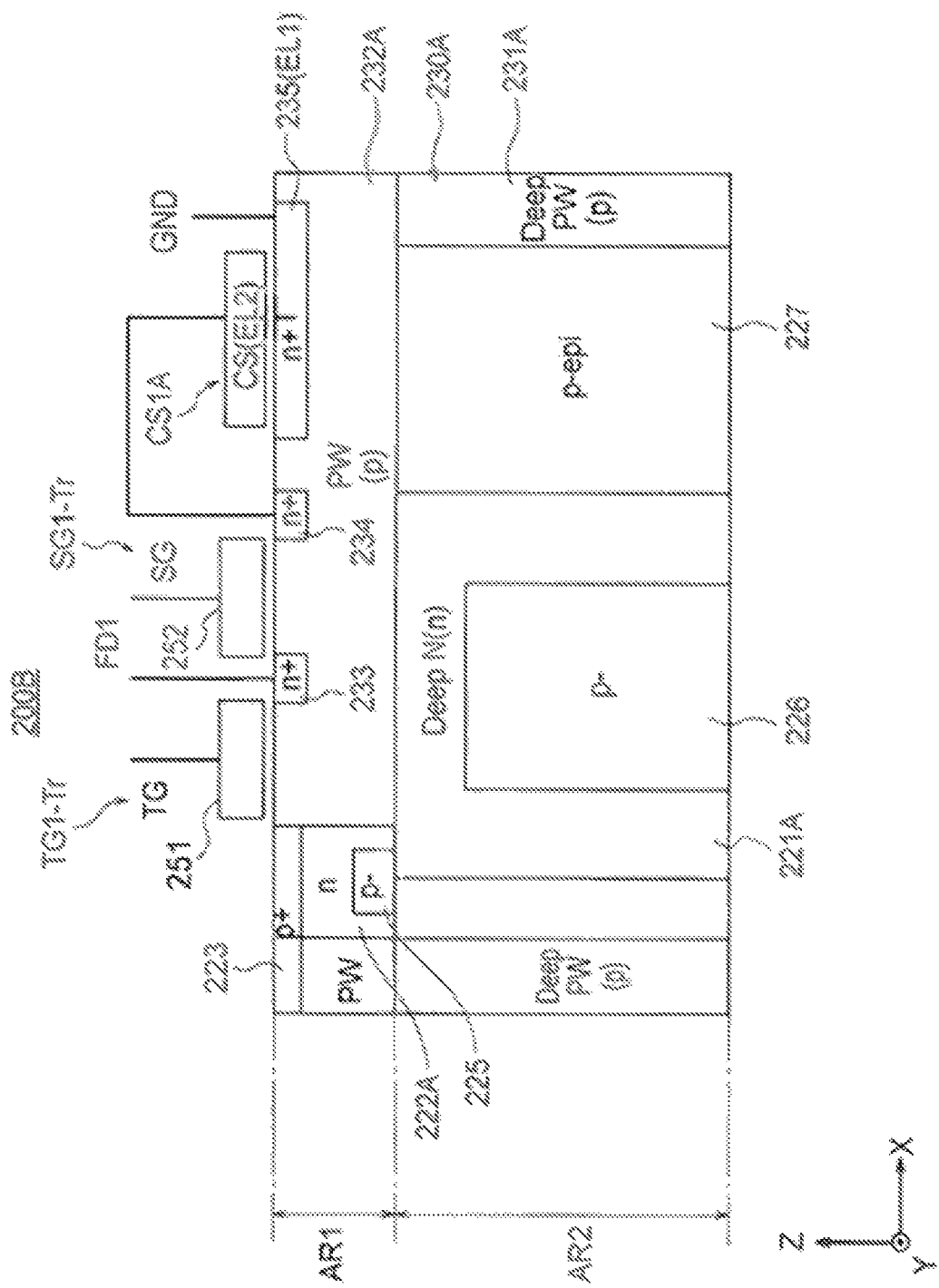
FIG. 7 is a simplified sectional view showing an example configuration of the pixel according to the third embodiment of the present invention.

FIG. 7 is a simplified sectional view showing an example configuration of the pixel according to the third embodiment of the present invention.

The pixel 200B of the third embodiment differs from the pixel 200A of the second embodiment (shown in FIG. 5) in the following points.

In the pixel 200B of the third embodiment, a p– region (a second conductivity type semiconductor region) 225 containing a low concentration of impurities is formed in a part of the n layer (the first conductivity type semiconductor layer) 222A in the first region AR1. This arrangement makes it possible that the peak voltage position of the photoelectric conversion part 220 as the photodiode PD1 is formed in the n layer (the first conductivity type semiconductor layer) 222A in the first region AR1 and a transfer residue (a residual image) of the stored charges (the signals) is reduced.

Further, in the pixel 200B of the third embodiment, a p– region (a second conductivity type semiconductor region) 226 containing a low concentration of impurities is formed in a part of the n layer (the first conductivity type semiconductor layer) 221A in the second region AR2. This arrangement makes it possible that the peak voltage position of the photoelectric conversion part 220 as the photodiode PD1 is formed in the n layer (the first conductivity type semiconductor layer) 222A in the first region AR1 and a transfer residue (a residual image) of the stored charges (the signals) is reduced.

In the pixel 200B of the third embodiment, a large epitaxial (epi) region 227 of p-type is left between the n layer (the first conductivity type semiconductor layer) 221A in the second region AR2 and the p layer (the second conductivity type semiconductor layer) 231A in the second region AR2, such that the substantial region of the n layer (the first conductivity type semiconductor layer) 221A is small. This arrangement also makes it possible that the peak voltage position of the photoelectric conversion part 220 as the photodiode PD1 is formed in the n layer (the first conductivity type semiconductor layer) 222A in the first region AR1 and a transfer residue (a residual image) of the stored charges (the signals) is reduced. The electrons produced by the photoelectric conversion in an epitaxial (epi) region 227 between the n layer (the first conductivity type semiconductor layer) 221A in the second region AR2 and the p layer (the second conductivity type semiconductor layer) 231A in the second area AR2 are transferred to and stored in the n layer (the first conductivity type semiconductor layer) 222A in the first region AR1 by the potential gradient.

Fourth Embodiment

Figure 8:
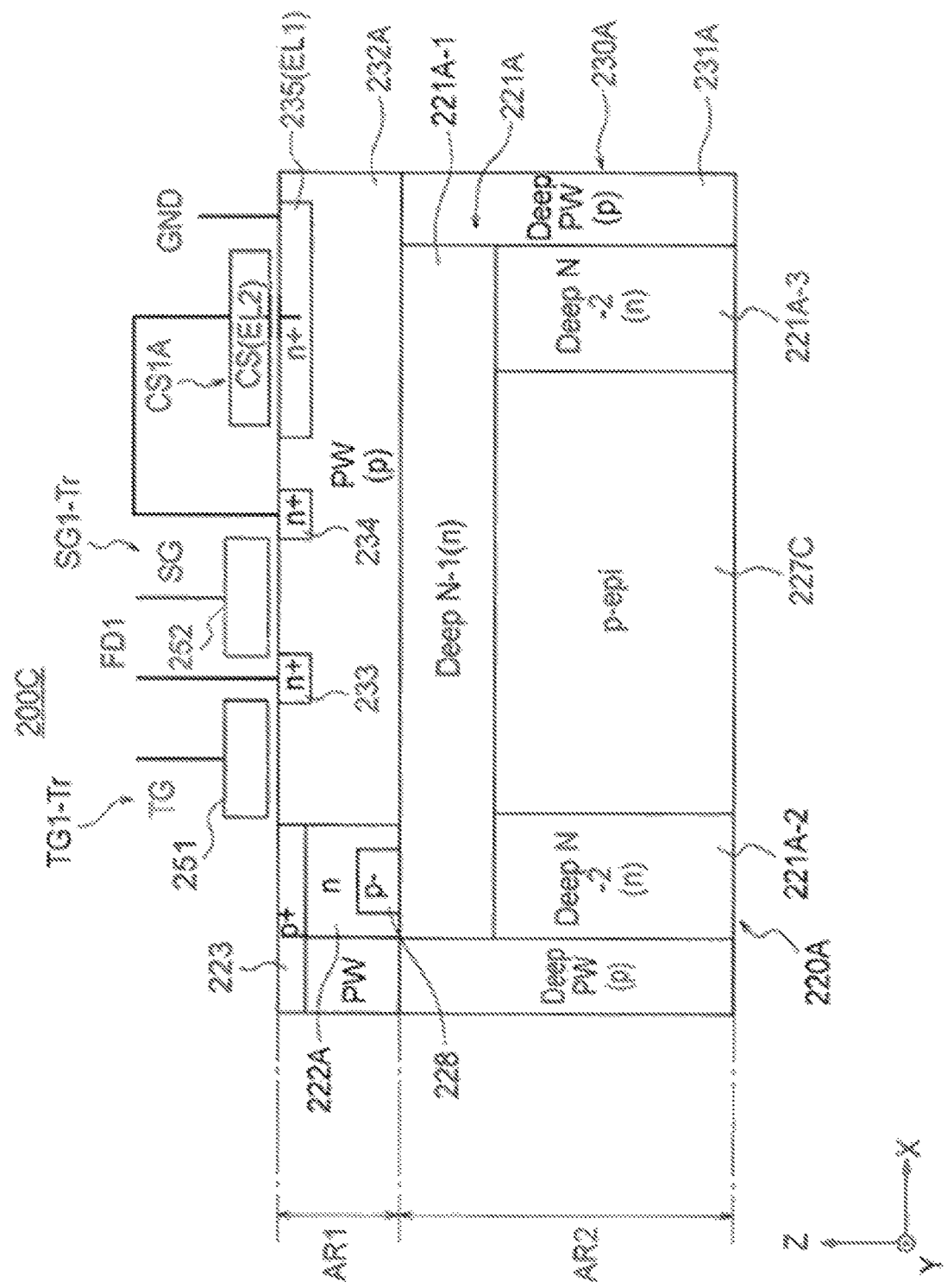
FIG. 8 is a simplified sectional view showing an example configuration of the pixel according to the fourth embodiment of the present invention.

FIG. 8 is a simplified sectional view showing an example configuration of the pixel according to the fourth embodiment of the present invention.

The pixel 200C of the fourth embodiment differs from the pixel 200A of the second embodiment (shown in FIG. 5) in the following points.

In the pixel 200C of the fourth embodiment, a p– region (a second conductivity type semiconductor region) 228 containing a low concentration of impurities is formed in a part of the n layer (the first conductivity type semiconductor layer) 222A in the first region AR1. This arrangement makes it possible that the peak voltage position of the photoelectric conversion part 220 as the photodiode PD1 is formed in the n layer (the first conductivity type semiconductor layer) 222A in the first region AR1 and a transfer residue (a residual image) of the stored charges (the signals) is reduced.

In the pixel 200C of the fourth embodiment, the n layer (the first conductivity type semiconductor layer) 221A in the second region AR2 is formed such that the n layer regions 221A-2, 221A-3 on the first substrate surface 211 side are smaller than the n layer region 221A-1 contacting with the n layer (the first conductivity type semiconductor layer) 222A in the first region AR1. More specifically, the n layer regions 221A-2, 221A-3 on the first substrate surface 211 side are separated with an epitaxial (epi) region 227C of p-type disposed therebetween. This arrangement makes it possible that the peak voltage position of the photoelectric conversion part 220 as the photodiode PD1 is formed in the n layer (the first conductivity type semiconductor layer) 222A in the first region AR1 and a transfer residue (a residual image) of the stored charges (the signals) is reduced. In this arrangement, the electrons produced by the photoelectric conversion in the n layers 221A-2, 221A-3 on the first substrate surface 211 side are transferred to and stored in the n layer (the first conductivity type semiconductor layer) 222A in the first region AR1 via the n layer region 221A-1.

Fifth Embodiment

Figure 9:
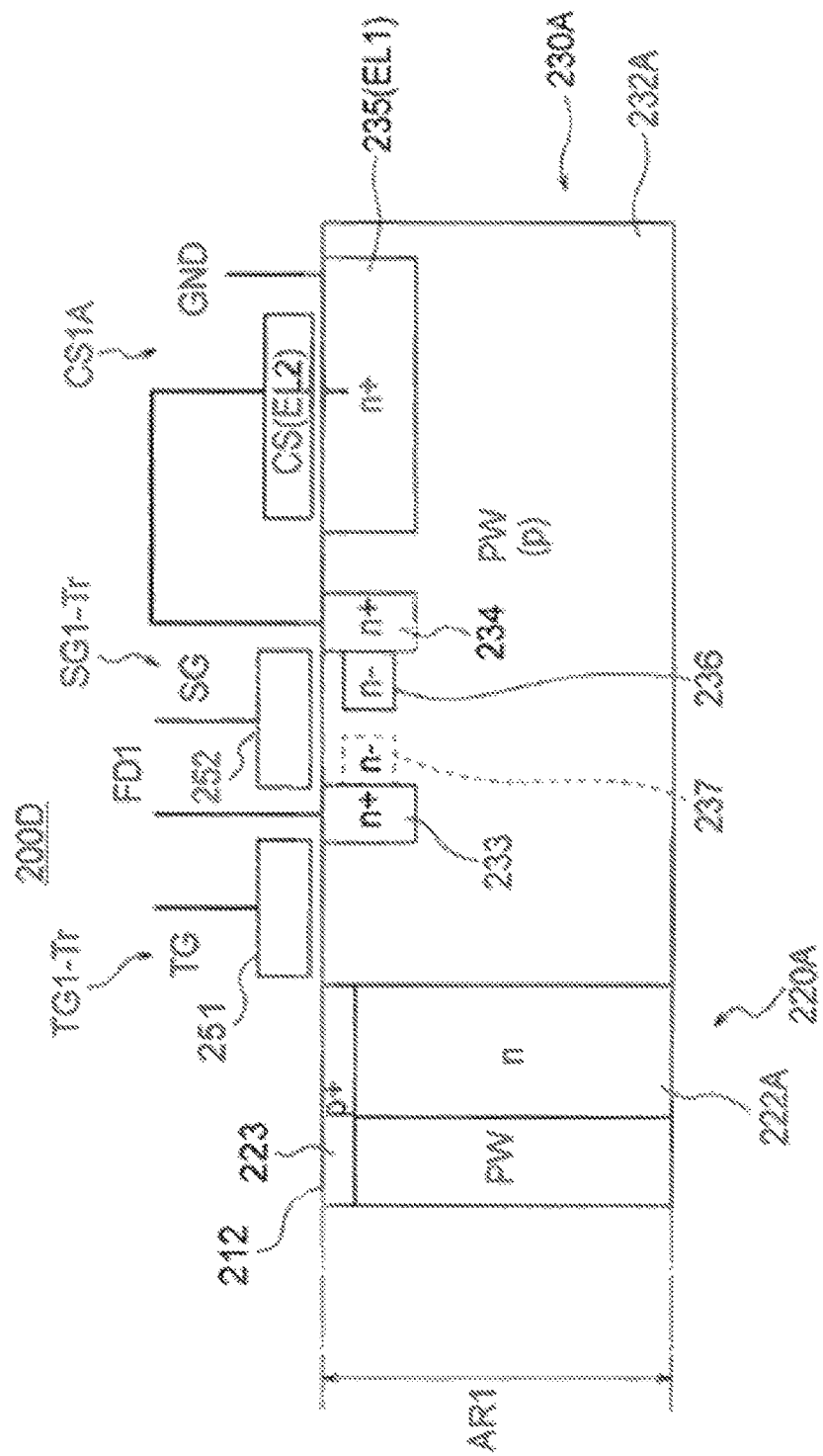
FIG. 9 is a simplified sectional view showing an example configuration of the pixel according to the fifth embodiment of the present invention.

FIG. 9 is a simplified sectional view showing an example configuration of the pixel according to the fifth embodiment of the present invention. For easier understanding, FIG. 9 focuses on the first region AR1 including modified or added parts and does not show the second region. In this embodiment, the second region may be the same as that of the second, third, or fourth embodiment described above (FIGS. 5 to 8).

The pixel 200D of the fifth embodiment differs from the pixel 200A of the second embodiment (shown in FIG. 5) in the following points.

In the pixel 200D of the fifth embodiment, an n– region (a first conductivity type semiconductor region) 236 is formed on the second substrate surface 212 side under the gate electrode 252 of the storage transistor SG1-Tr so as to connect to the n+ region (the first conductivity type semiconductor region) 234 as the capacitance connection node ND1. The n– region (the first conductivity type semiconductor region) 236 contains a lower concentration of impurities than the n layers (the first conductivity type semiconductor layers) 221A, 222A of the photoelectric conversion part 220A.

This arrangement forms the potential gradient under the gate electrode 252 of the storage transistor SG1-Tr, such that the charge injection occurring when the storage transistor SG1-Tr is switched off flows into the storage capacitor CS1A, instead of the floating diffusion FD1. The capacitance is smaller on the floating diffusion FD1 side to implement a higher sensitivity, while the capacitance is larger on the storage capacitor CS1 side to implement higher saturation, and therefore, the charge injection converted into a voltage is small, and it is possible to expand the full scale of signals and lower the voltages.

When the pixel 200D is of a shared pixel design in which the floating diffusion FD1 is shared by a plurality of photoelectric conversion parts 220 and a plurality of transfer transistors TG1-Tr, it is possible that, as shown by the broken line in FIG. 9, an n– region (a first conductivity type semiconductor region) 237 is formed on the second substrate surface 212 side under the gate electrode 252 of the storage transistor SG1-Tr so as to connect to the n+ region (the first conductivity type semiconductor region) 233 as the FD node, and the n– region (the first conductivity type semiconductor region) 237 contains a lower concentration of impurities than the n layers (the first conductivity type semiconductor layers) 221A, 222A of the photoelectric conversion part 220A. In the shared pixel design, the n+ region (the first conductivity type semiconductor region) 233 as the FD node can be reset prior to reading the signals, and therefore, an n− material containing a lower concentration of impurities is injected on the floating diffusion FD1 side under the gate electrode 251 of the storage transistor SG1-Tr.

Sixth Embodiment

Figure 10:
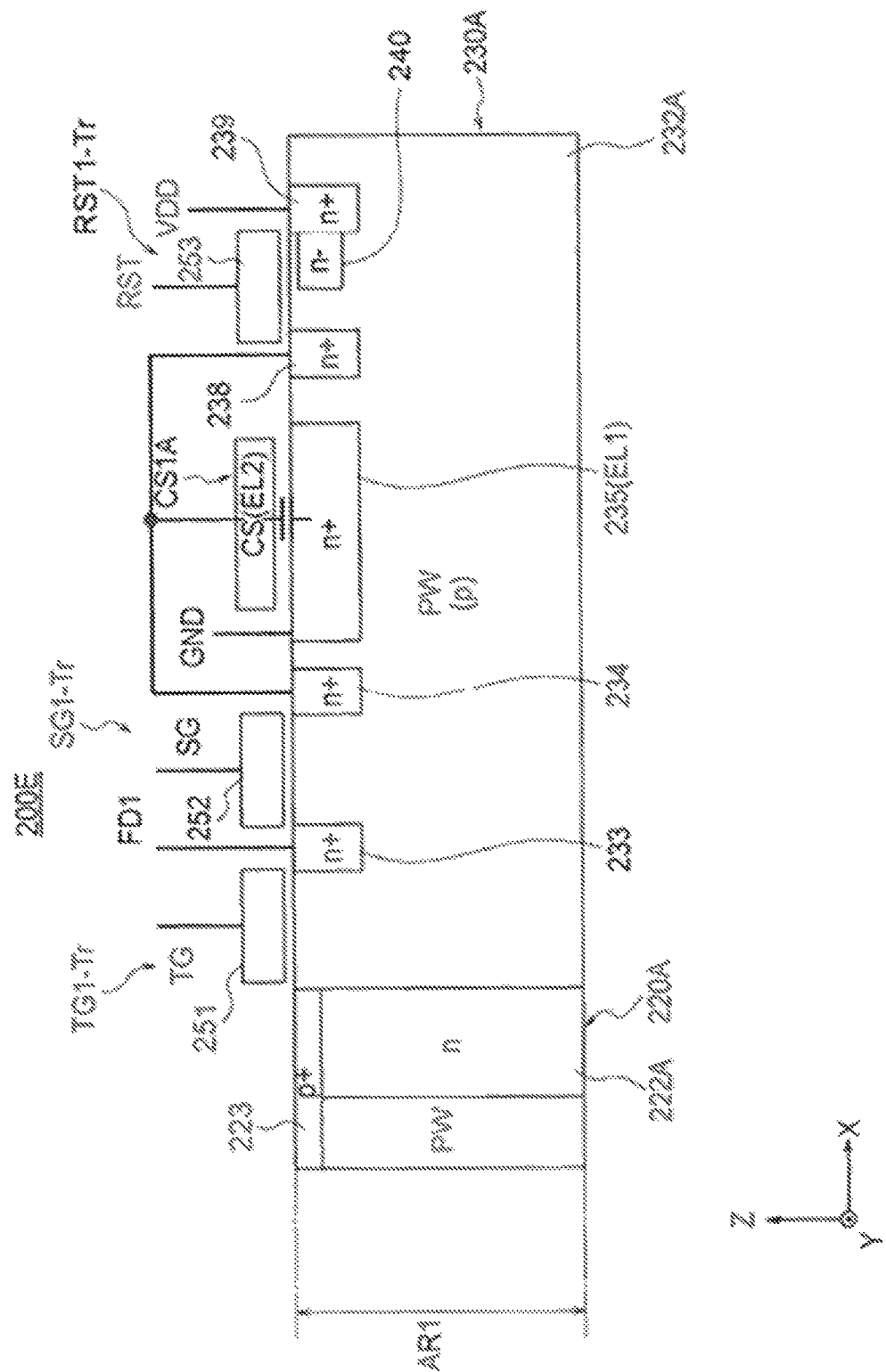
FIG. 10 is a simplified sectional view showing an example configuration of the pixel according to the sixth embodiment of the present invention.

FIG. 10 is a simplified sectional view showing an example configuration of the pixel according to the sixth embodiment of the present invention. For easier understanding, FIG. 10 focuses on the first region AR1 including modified or added parts and does not show the second region. In this embodiment, the second region may be the same as that of the second, third, or fourth embodiment described above (FIGS. 5 to 8).

The pixel 200E of the sixth embodiment differs from the pixel 200A of the second embodiment (shown in FIG. 5) in the following points.

The pixel 200E of the sixth embodiment includes the reset transistor RST1-Tr. As in the example shown in FIG. 2, for example, the storage transistor SG1-Tr is connected between the floating diffusion FD1 and the reset transistor RST1-Tr, and the storage capacitor CS1A is connected between the connection node of the storage transistor SG1-Tr and the reference potential VSS.

The connection node connecting the reset transistor RST1-Tr to the storage capacitor CS1A and the storage transistor SG1-Tr (and further to the floating diffusion FD1) is formed in the surface of the second substrate surface 212 of the substrate 210 to constitute an n+ region (the first conductivity type semiconductor region) 238 containing a higher concentration of impurities than the n layers (the first conductivity type semiconductor layers) 221A, 222A of the photoelectric conversion part 220A. The power supply connection node connecting the reset transistor RST1-Tr to the power supply potential VDD is formed in the surface of the second substrate surface 212 of the substrate 210 to constitute an n+ region (the first conductivity type semiconductor region) 239 containing a higher concentration of impurities than the n layers (the first conductivity type semiconductor layers) 221A, 222A of the photoelectric conversion part 220A. The reset transistor RST1-Tr includes a gate electrode 253 disposed above the second substrate surface 212 of the substrate 210 between the n+ region (the first conductivity type semiconductor region) 238 as the connection node and the n+ region (the first conductivity type semiconductor region) 239 as the power supply connection node. In the pixel 200E of the sixth embodiment, an n− region (a first conductivity type semiconductor region) 240 is formed on the second substrate surface 212 side under the gate electrode 253 of the reset transistor RST1-Tr so as to connect to the n+ region (the first conductivity type semiconductor region) 239 as the power supply connection node. The n− region (the first conductivity type semiconductor region) 240 contains a lower concentration of impurities than the n layers (the first conductivity type semiconductor layers) 221A, 222A of the photoelectric conversion part 220A.

As described above, the n− region (the first conductivity type semiconductor region) 240 containing a lower concentration of impurities is formed on the second substrate surface 212 side under the gate electrode 253 of the reset transistor RST1-Tr so as to connect to the n+ region (the first conductivity type semiconductor region) 239 as the power supply connection node. This arrangement forms the potential gradient under the gate electrode 253, such that the charge injection occurring when the reset transistor RST1-Tr is switched off flows into the power supply potential VAA, instead of the storage capacitor CS1A (or the floating diffusion FD1). As a result, the charge injection is small, and it is possible to expand the full scale of signals and lower the voltages.

Seventh Embodiment

Figure 11:
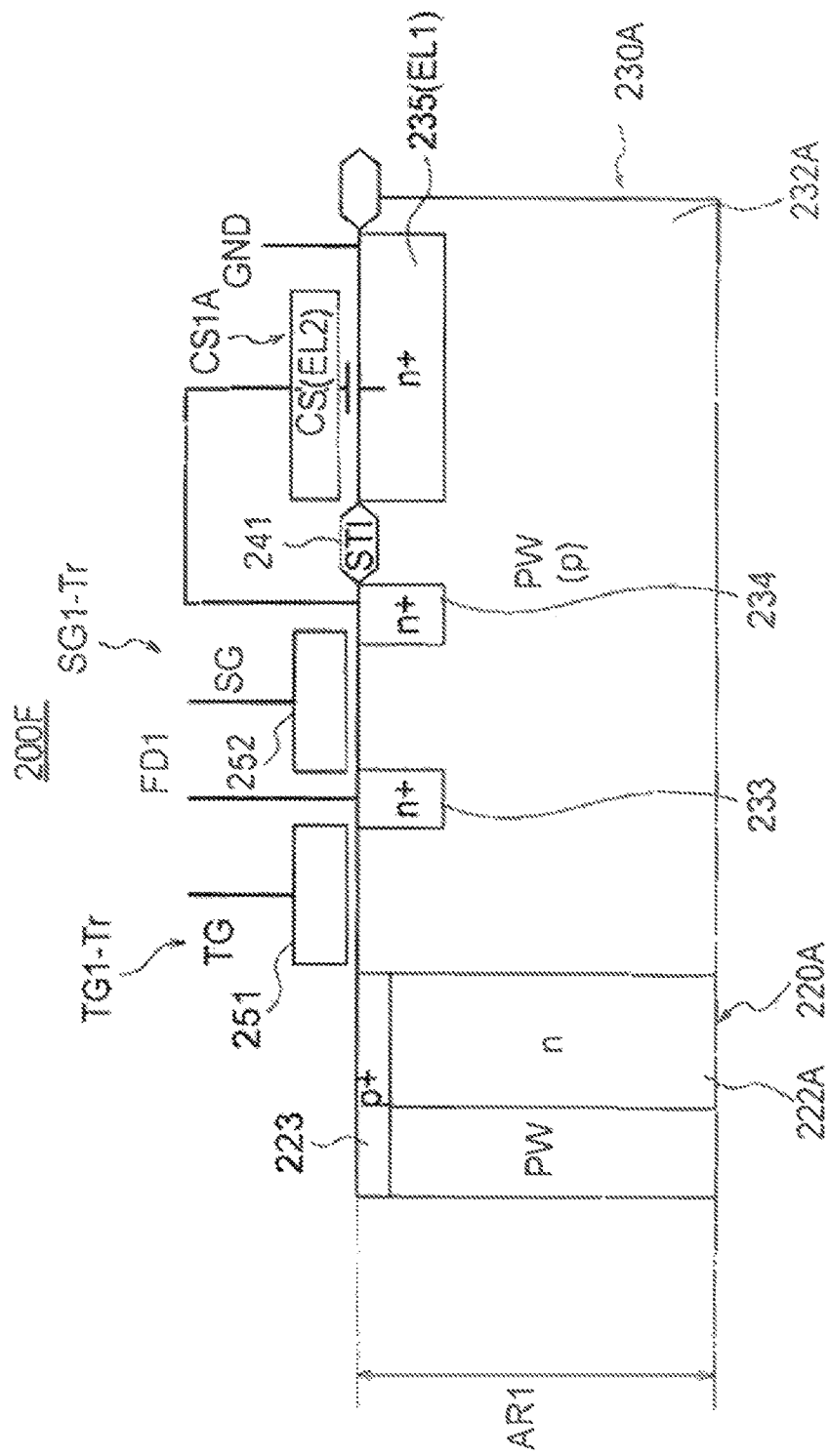
FIG. 11 is a simplified sectional view showing an example configuration of the pixel according to the seventh embodiment of the present invention.

FIG. 11 is a simplified sectional view showing an example configuration of the pixel according to the seventh embodiment of the present invention. For easier understanding, FIG. 11 focuses on the first region AR1 including modified or added parts and does not show the second region. In this embodiment, the second region may be the same as that of the second, third, or fourth embodiment described above (FIGS. 5 to 8).

The pixel 200F of the seventh embodiment differs from the pixel 200A of the second embodiment (shown in FIG. 5) in that the storage capacitor CS1A is isolated by an STI (shallow trench isolation) 241.

In the seventh embodiment, it is possible to reduce the dark current leaking from the first electrode EL1 to the second electrode EL2 of the storage capacitor CS1A via the n+ region (the first conductivity type semiconductor region) 234.

Eighth Embodiment

Figure 12A:
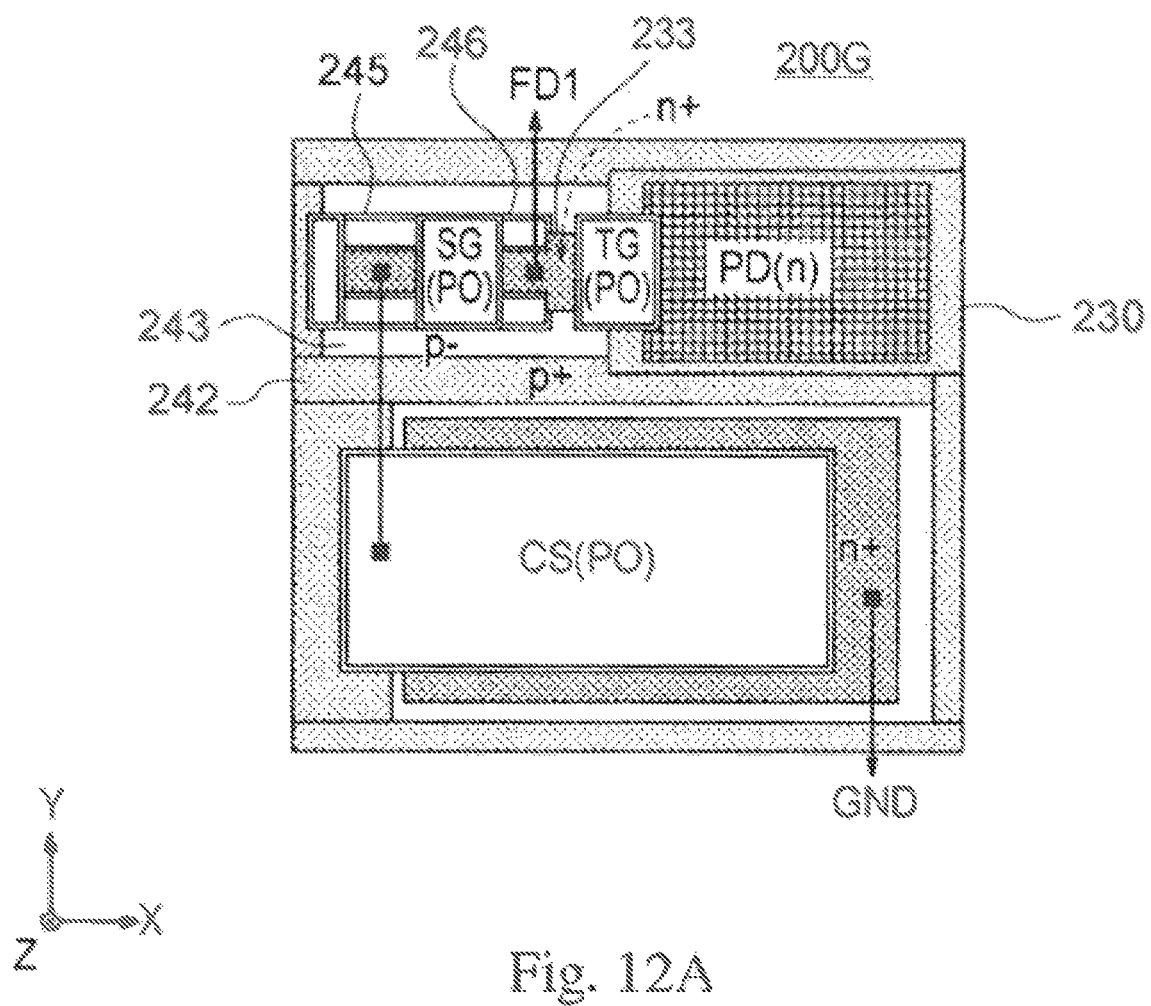
FIG. 12A is a plan view showing an example configuration of the pixel according to the eighth embodiment of the present invention.
Figure 12B:
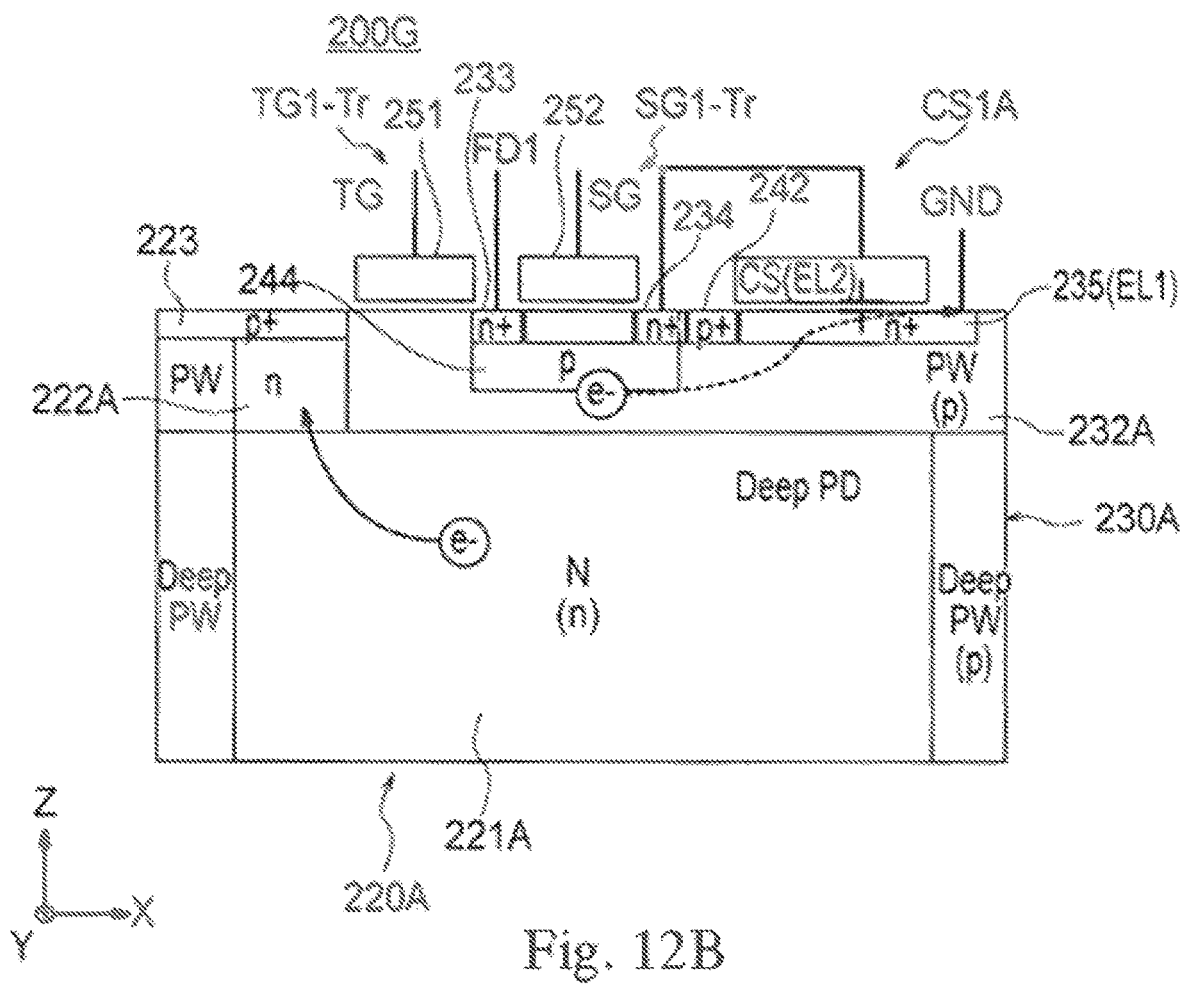
FIG. 12B is a simplified sectional view showing the same.

FIG. 12A is a plan view showing an example configuration of the pixel according to the eighth embodiment of the present invention, and FIG. 12B is a simplified sectional view showing the same.

The pixel 200G of the eighth embodiment differs from the pixel 200A of the second embodiment (shown in FIG. 5) in the following points.

In the pixel 200G of the eighth embodiment, a p+ region (a second conductivity type semiconductor region) 242 for device isolation is formed in at least a surface portion on the second substrate surface 212 side between the n+ region (the first conductivity type semiconductor region) 235 as the first electrode EL1 of the storage capacitor CS1A and the n+ region (the first conductivity type semiconductor region) 234 as the capacitance connection node of the storage transistor SG1-Tr. The p+ region (a second conductivity type semiconductor region) 242 contains a higher concentration of impurities than the p layer (the second conductivity type semiconductor layer) 230 in a side portion. This arrangement reduces the dark current leaking from the first electrode EL1 to the second electrode EL2 of the storage capacitor CS1A via the n+ region (the first conductivity type semiconductor region) 234.

As shown in FIG. 12A, in the pixel 200G of the eighth embodiment, a p− region (a second conductivity type semiconductor region) 243 containing a low concentration of impurities is formed between the n+ region (the first conductivity type semiconductor region) 233 as the floating diffusion FD1 and the p+ region (the second conductivity type semiconductor region) 242 for device isolation. This arrangement reduces the junction capacitance of the n+ region (the first conductivity type semiconductor region) 233 as the floating diffusion FD1 and improves the conversion and sensitivity.

In the pixel 200G of the eighth embodiment, a p region (a second conductivity type semiconductor region) 244 is formed in a region between the n+ region (the first conductivity type semiconductor region) 233 as the floating diffusion FD1 and the n+ region (the first conductivity type semiconductor region) 234 as the capacitance connection node and deeper from the surface of the second substrate surface 212 than these n+ regions (the first conductivity type semiconductor regions) 233, 234. This arrangement reduces the parasitic light sensitivity.

In the pixel 200G of the eighth embodiment, ring parts 245, 246 for limiting active regions surround the n+ region (the first conductivity type semiconductor region) 233 as the floating diffusion FD1 and the n+ region (the first conductivity type semiconductor region) 234 as the capacitance connection node. Narrowing the active regions makes it possible that the electrons produced by the photoelectric conversion in a shallow region of a part of incident light having a long wavelength are transferred to the source and/or the drain of the storage transistor so as to reduce the parasitic light sensitivity.

Ninth Embodiment

Figure 13A:
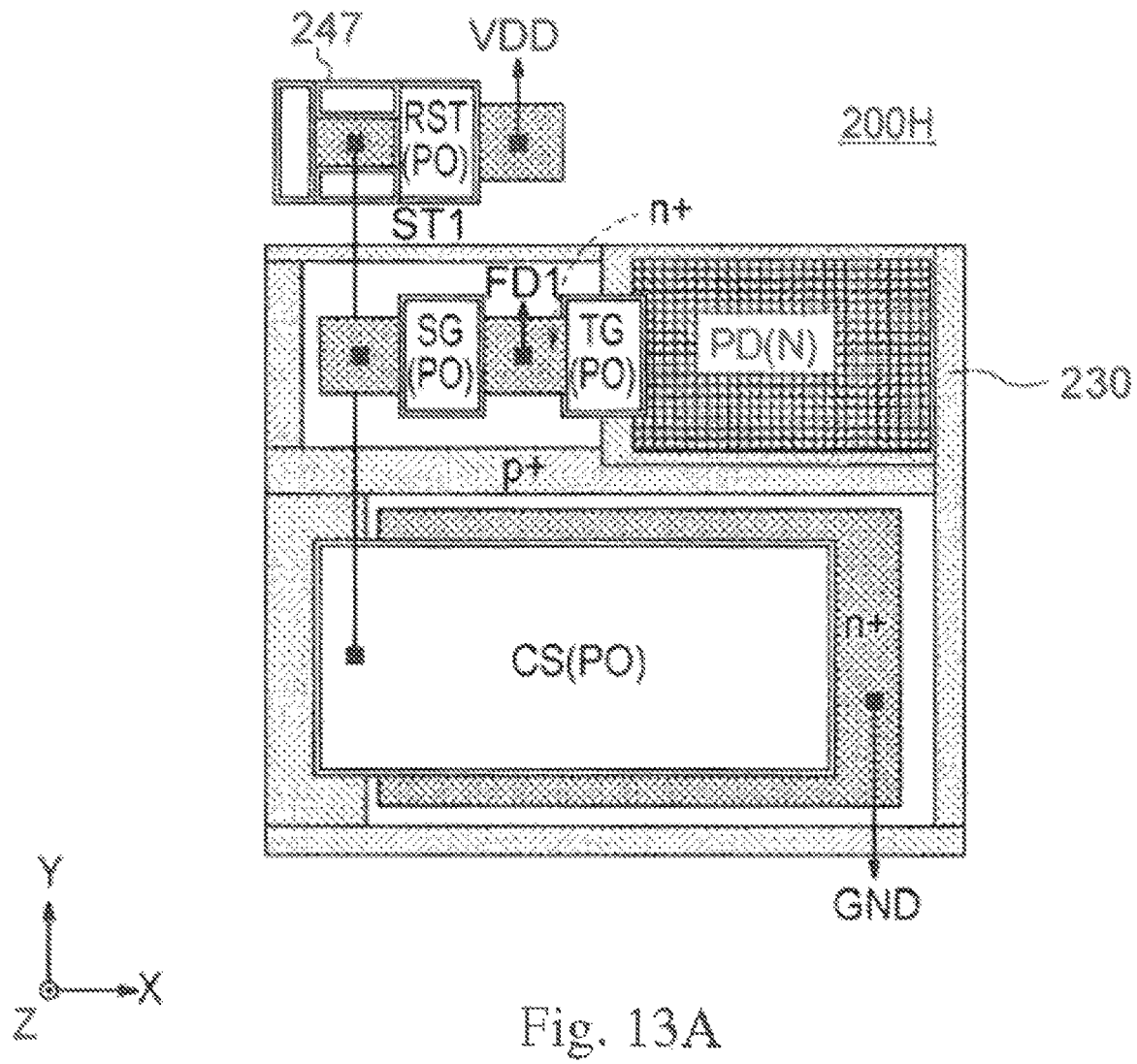
FIG. 13A is a plan view showing an example configuration of the pixel according to the ninth embodiment of the present invention.
Figure 13B:
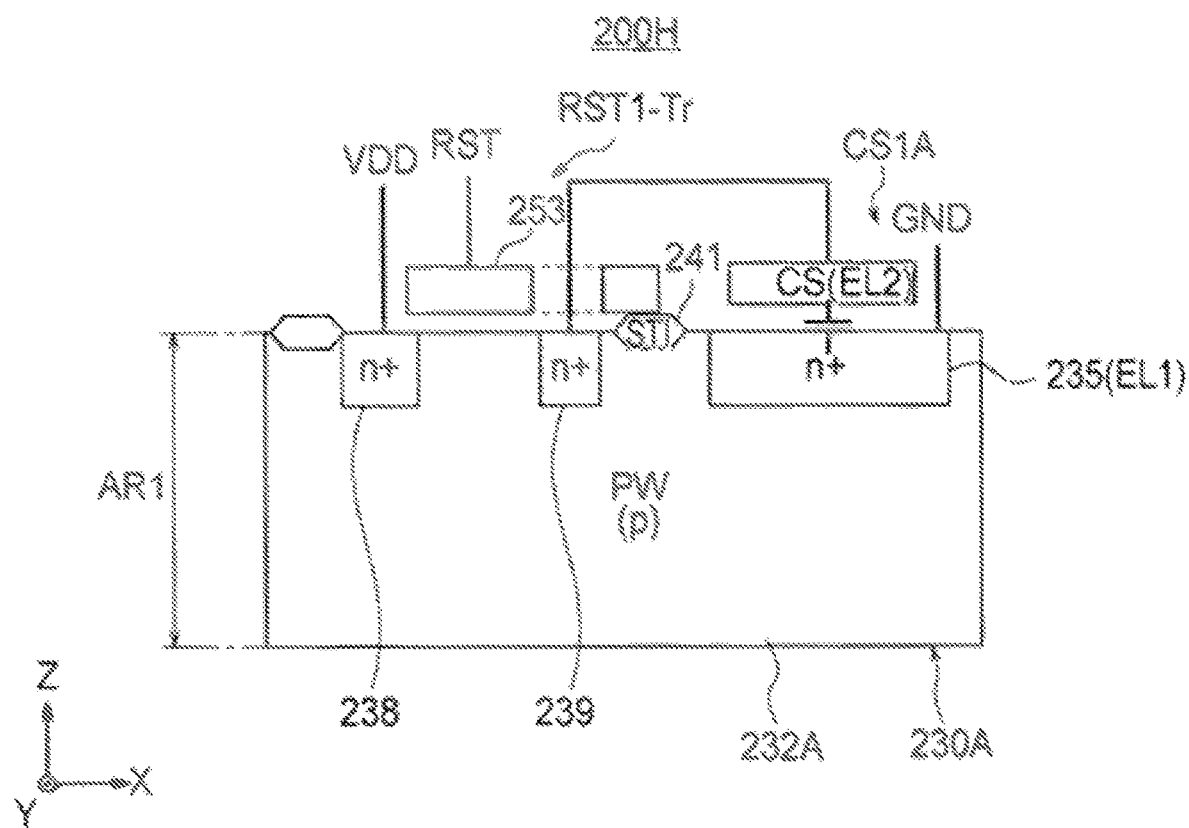
FIG. 13B is a simplified sectional view showing the same.

FIG. 13A is a plan view showing an example configuration of the pixel according to the ninth embodiment of the present invention, and FIG. 13B is a simplified sectional view showing the same. For easier understanding, FIG. 13B focuses on the first region AR1 including modified or added parts and does not show the second region. In this embodiment, the second region may be the same as that of the second, third, or fourth embodiment described above (FIGS. 5 to 8).

The pixel 200H of the ninth embodiment differs from the pixel 200E of the sixth embodiment (shown in FIG. 10) in the following points.

In the pixel 200H of the ninth embodiment, the storage capacitor CS1A is isolated by an STI (shallow trench isolation) 241. In addition, the gate electrode 253 of the reset transistor RST1-Tr is surrounded by a ring part 247 for limiting the n+ region so as to narrow the region for injecting n-type ions, such that the STI and the n+ region 235 of the storage capacitor CS1A are isolated from each other by injection of p-type ions. As a result, the dark current occurring from the STI interface is not stored in the storage capacitor CS1A, thus reducing the noise.

Tenth Embodiment

Figure 14A:
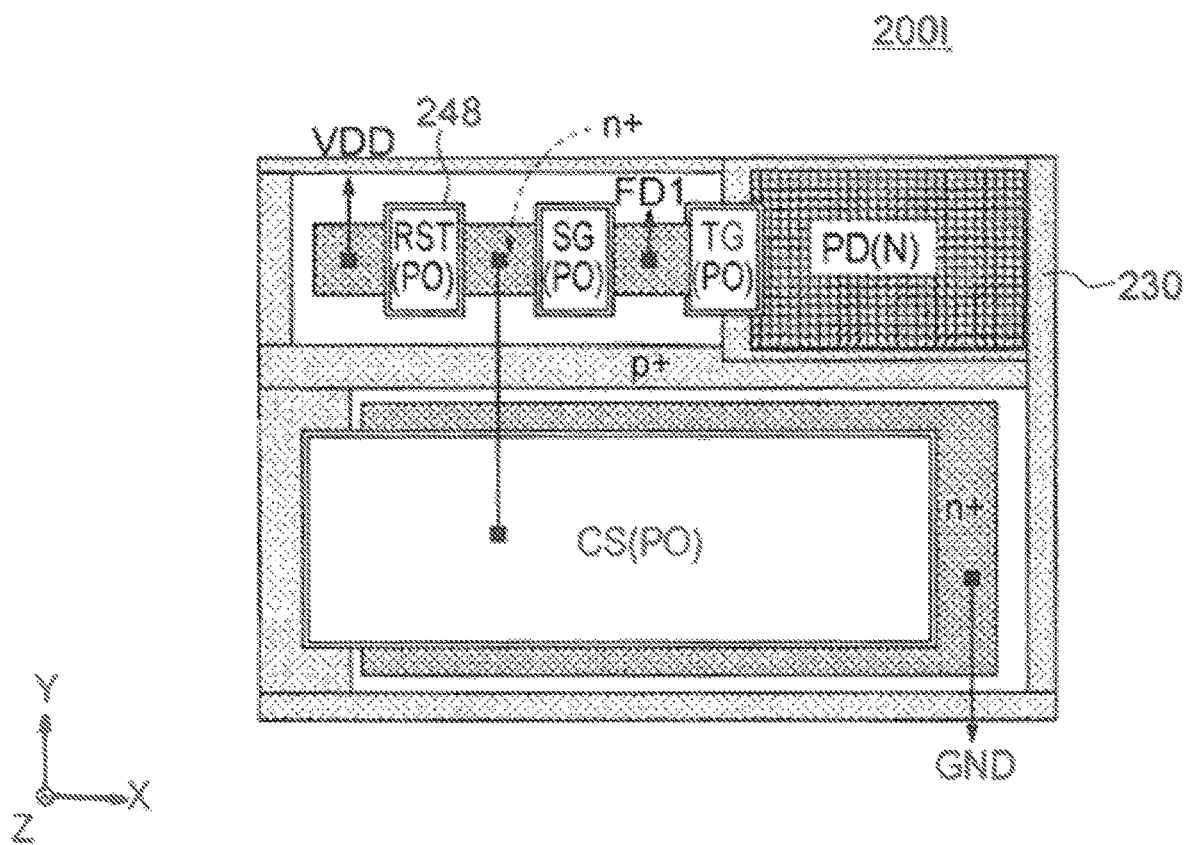
FIG. 14A is a plan view showing an example configuration of the pixel according to the tenth embodiment of the present invention.
Figure 14B:
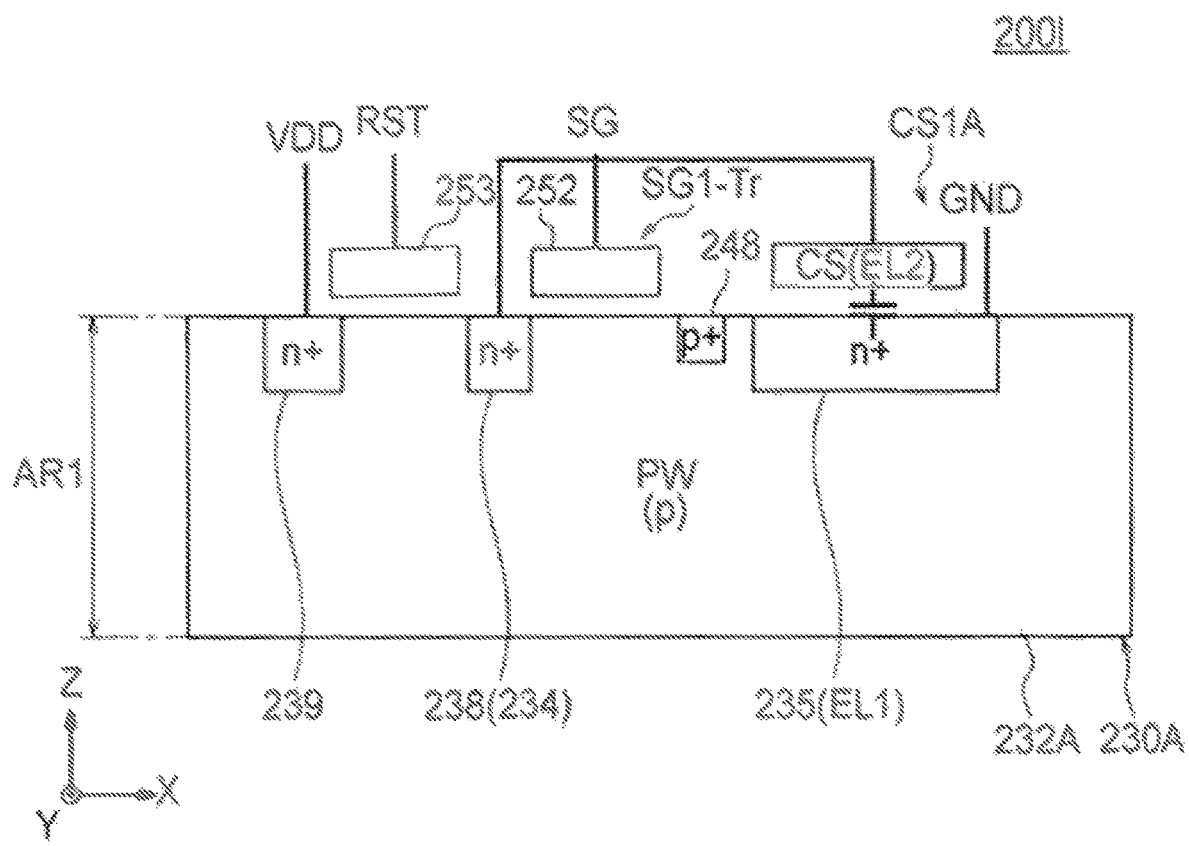
FIG. 14B is a simplified sectional view showing the same.

FIG. 14A is a plan view showing an example configuration of the pixel according to the tenth embodiment of the present invention, and FIG. 14B is a simplified sectional view showing the same. For easier understanding, FIG. 14B focuses on the first region AR1 including modified or added parts and does not show the second region. In this embodiment, the second region may be the same as that of the second, third, or fourth embodiment described above (FIGS. 5 to 8).

The pixel 200I of the tenth embodiment differs from the pixel 200E of the sixth embodiment (shown in FIG. 10) and the pixel 200H of the ninth embodiment (shown in FIGS. 13A and 13B) in the following points.

In the pixel 200I of the tenth embodiment, the source (on the CS side) of the reset transistor RST1-Tr and the drain (on the CS side) and the source (FD) of the storage transistor SG1-Tr are isolated by a p-type injection layer (a p+ layer) 248. As a result, the dark current occurring is not stored in the floating diffusion FD1 and the storage capacitor CS1A, thus reducing the noise. In other words, in the pixel 200I, a p+ layer (a second conductivity type semiconductor region) 248 for device isolation is formed in at least a surface portion on the second substrate surface 212 side between the n+ region (the first conductivity type semiconductor region) 235 as the first electrode EL1 of the storage capacitor CS1A and the n+ region (the first conductivity type semiconductor region) 233 (not shown in FIGS. 14A and 14B) as the floating diffusion FD1.

In the example shown in FIG. 14B, the n+ layer 238 serves as both the source (on the CS side) of the reset transistor RST1-Tr and the drain (on the CS side) of the storage transistor SG1-Tr. This arrangement is optional.

Eleventh Embodiment

Figure 15:
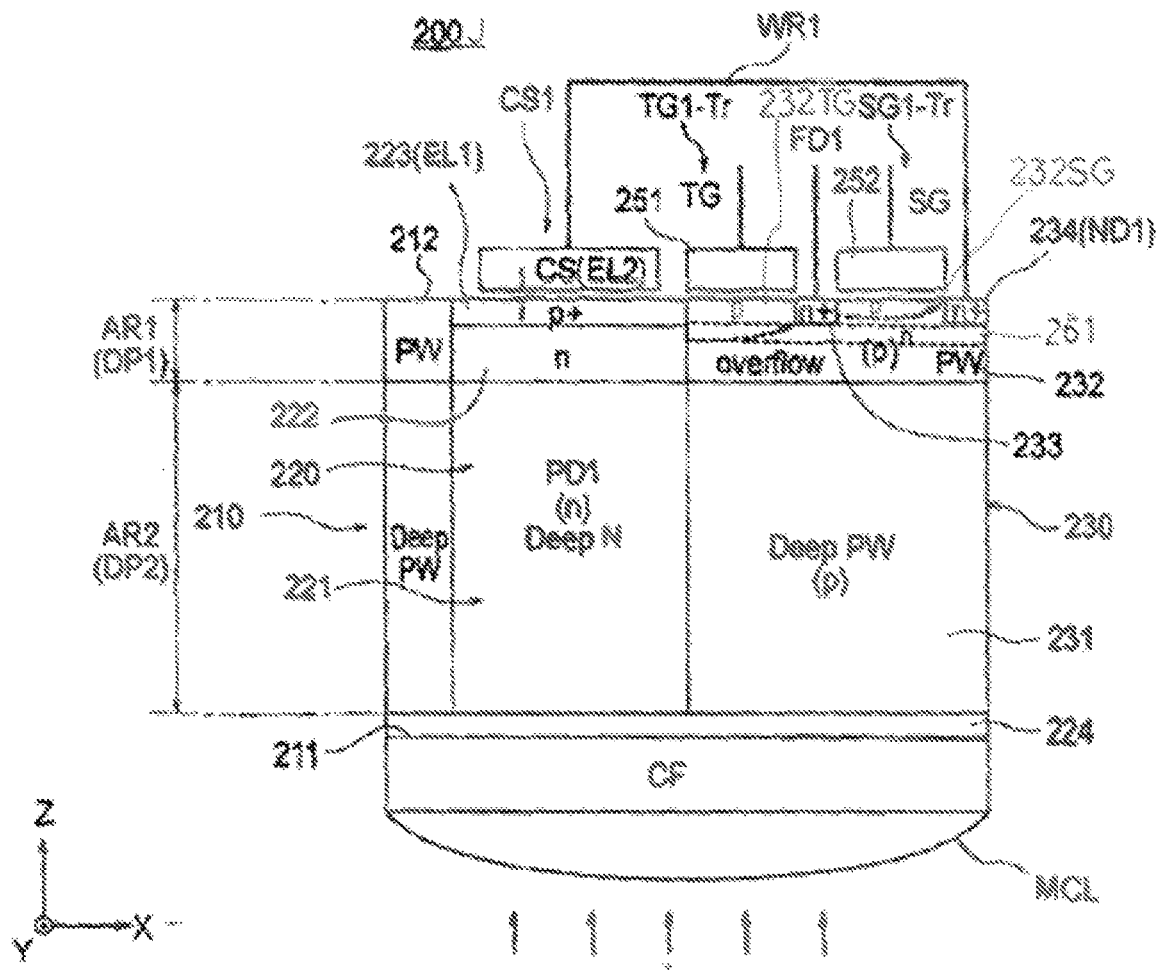
FIG. 15 is a simplified sectional view showing an example configuration of the pixel according to the eleventh embodiment of the present invention.

FIG. 15 is a simplified sectional view showing an example configuration of the pixel according to the eleventh embodiment of the present invention.

The pixel 200J of the eleventh embodiment differs from the pixel 200 of the first embodiment (shown in FIG. 4) in the following points.

The pixel 200J of the eleventh embodiment includes an overflow path 261 for overflow charges in the photodiode PD1. The overflow path 261 is positioned directly below the transfer transistor TG1-Tr, the n+ region (the first conductivity type semiconductor region) 233 as the floating diffusion FD1, the storage transistor SG1-Tr, and the n+ region (the first conductivity type semiconductor region) 234 as the capacitance connection node ND1.

The overflow path 261 is formed of, for example, an n-type (first conductivity type) pinned layer. More specifically, the overflow path 261 is formed as, for example, an n-type (first conductivity type) embedded layer positioned in a region deeper from the surface of the second substrate surface 212 than a p region (a second conductivity type semiconductor region) 232TG as a channel formation region for the transfer transistor TG1-Tr, the n+ region (the first conductivity type semiconductor region) 233 as the floating diffusion FD1, a p region (a second conductivity type semiconductor region) 232SG as a channel formation region for the storage transistor SG1-Tr, and the n+ region (the first conductivity type semiconductor region) 234 as the capacitance connection node ND1, each formed in the surface of the second substrate surface 212.

In the pixel 200J including the overflow path 261, in storing charges, the transfer transistor TG1-Tr and the storage transistor SG1-Tr are maintained at a gate potential of, for example, −1 V and enter the accumulation (storage) state. In this state, dark current charges occurring at a silicon interface are suppressed, and charges over the saturation charge are transferred to the floating diffusion FD1 and the storage capacitor CS1 as an overflow capacitor via the overflow path 261 without blooming to adjacent pixels and other elements.

Figure 16:
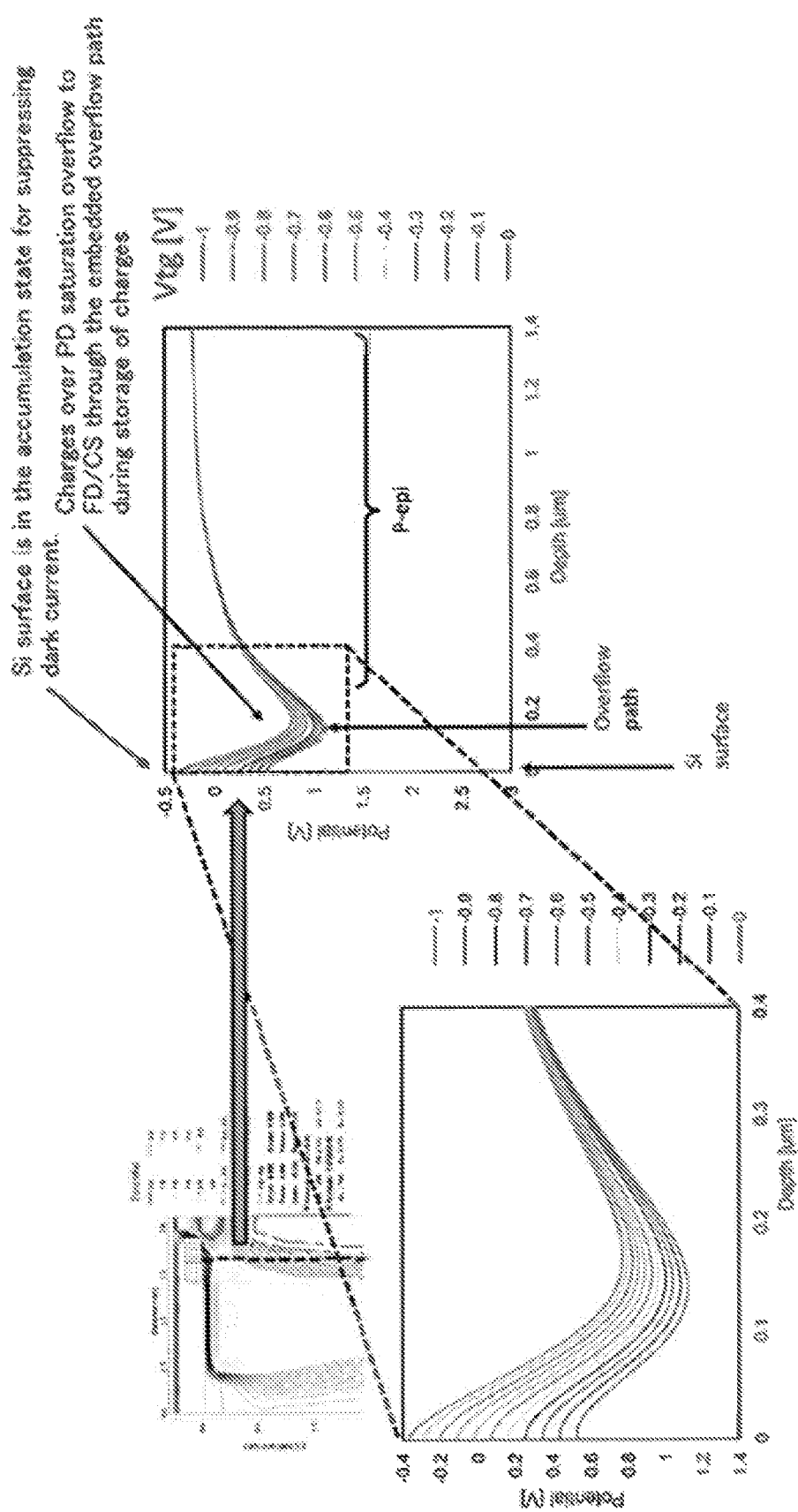
FIG. 16 shows a potential profile of a section under the transfer transistor of the pixel according to the eleventh embodiment during storage of charges.

FIG. 16 shows a potential profile of a section under the transfer transistor of the pixel according to the eleventh embodiment during storage of charges.

As shown in FIG. 15, the overflow path 261 is configured to optimize the n-type dopant concentration and the thickness of the embedded layer such that it is formed at a sufficient depth directly below an interface under the transfer transistor TG1-Tr to reduce the dark current.

Twelfth Embodiment

Figure 17:
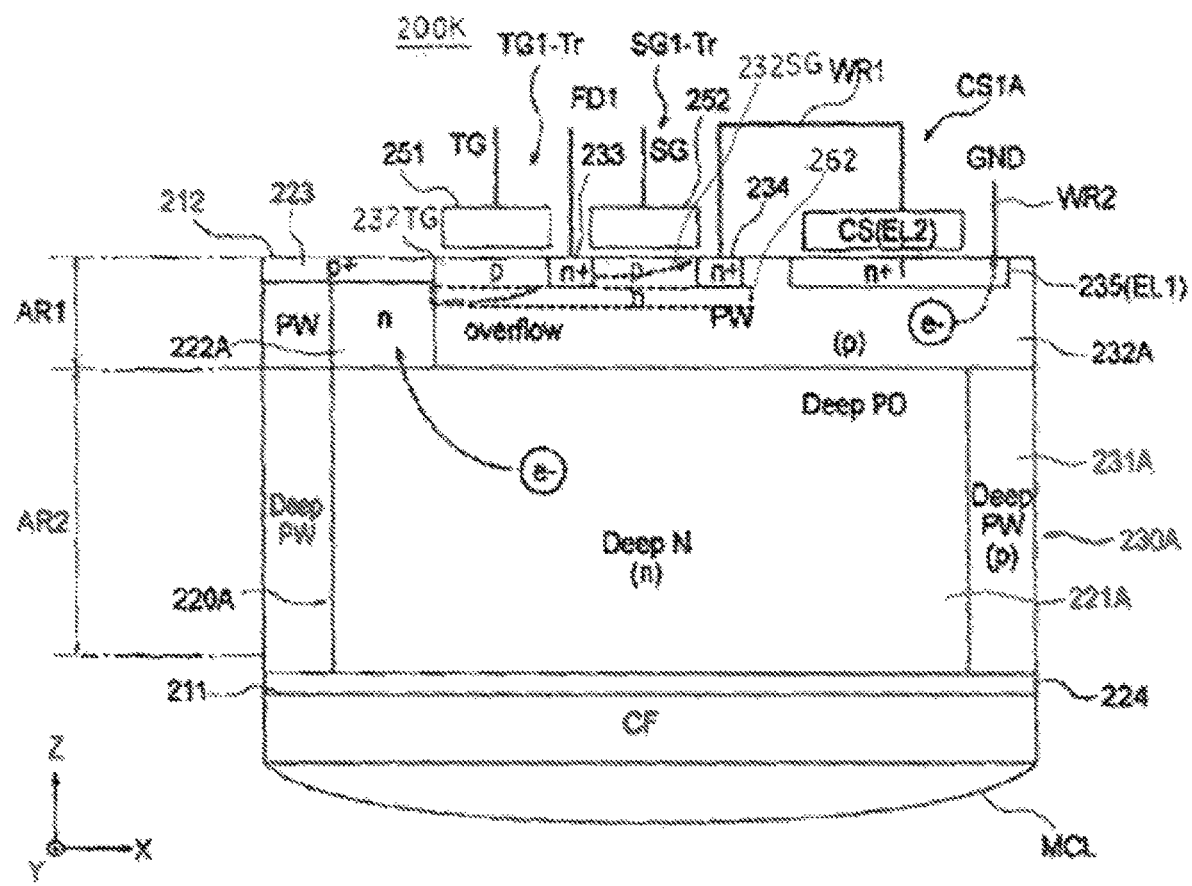
FIG. 17 is a simplified sectional view showing an example configuration of the pixel according to the twelfth embodiment of the present invention.

FIG. 17 is a simplified sectional view showing an example configuration of the pixel according to the twelfth embodiment of the present invention.

The pixel 200K of the twelfth embodiment differs from the pixel 200A of the second embodiment (shown in FIG. 5) in the following points.

The pixel 200K of the twelfth embodiment includes an overflow path 262 for overflow charges in the photodiode PD1. The overflow path 262 is positioned directly below the transfer transistor TG1-Tr, the n+ region (the first conductivity type semiconductor region) 233 as the floating diffusion FD1, the storage transistor SG1-Tr, and the n+ region (the first conductivity type semiconductor region) 234 as the capacitance connection node.

The overflow path 262 is formed of, for example, an n-type (first conductivity type) pinned layer. More specifically, the overflow path 262 is formed as, for example, an n-type (first conductivity type) embedded layer positioned in a region deeper from the surface of the second substrate surface 212 than a p region (a second conductivity type semiconductor region) 232TG as a channel formation region for the transfer transistor TG1-Tr, the n+ region (the first conductivity type semiconductor region) 233 as the floating diffusion FD1, a p region (a second conductivity type semiconductor region) 232SG as a channel formation region for the storage transistor SG1-Tr, and the n+ region (the first conductivity type semiconductor region) 234 as the capacitance connection node ND1, each formed in the surface of the second substrate surface 212.

In the pixel 200K including the overflow path 262, in storing charges, the transfer transistor TG1-Tr and the storage transistor SG1-Tr are maintained at a gate potential of, for example, −1 V and enter the accumulation (storage) state. In this state, dark current charges occurring at a silicon interface are suppressed, and charges over the saturation charge are transferred to the floating diffusion FD1 and the storage capacitor CS1 as an overflow capacitor via the overflow path 262 without blooming to adjacent pixels and other elements.

As shown in FIG. 17, the overflow path 262 is configured to optimize the n-type dopant concentration and the thickness of the embedded layer such that it is formed at a sufficient depth directly below an interface under the transfer transistor TG1-Tr to reduce the dark current.

The solid-state imaging device 10 of the embodiment is applicable to a backside illumination (BSI) image sensor.

The solid-state imaging device 10 described above can be applied, as an imaging device, to electronic apparatuses such as digital cameras, video cameras, mobile terminals, surveillance cameras, and medical endoscope cameras.

Figure 18:
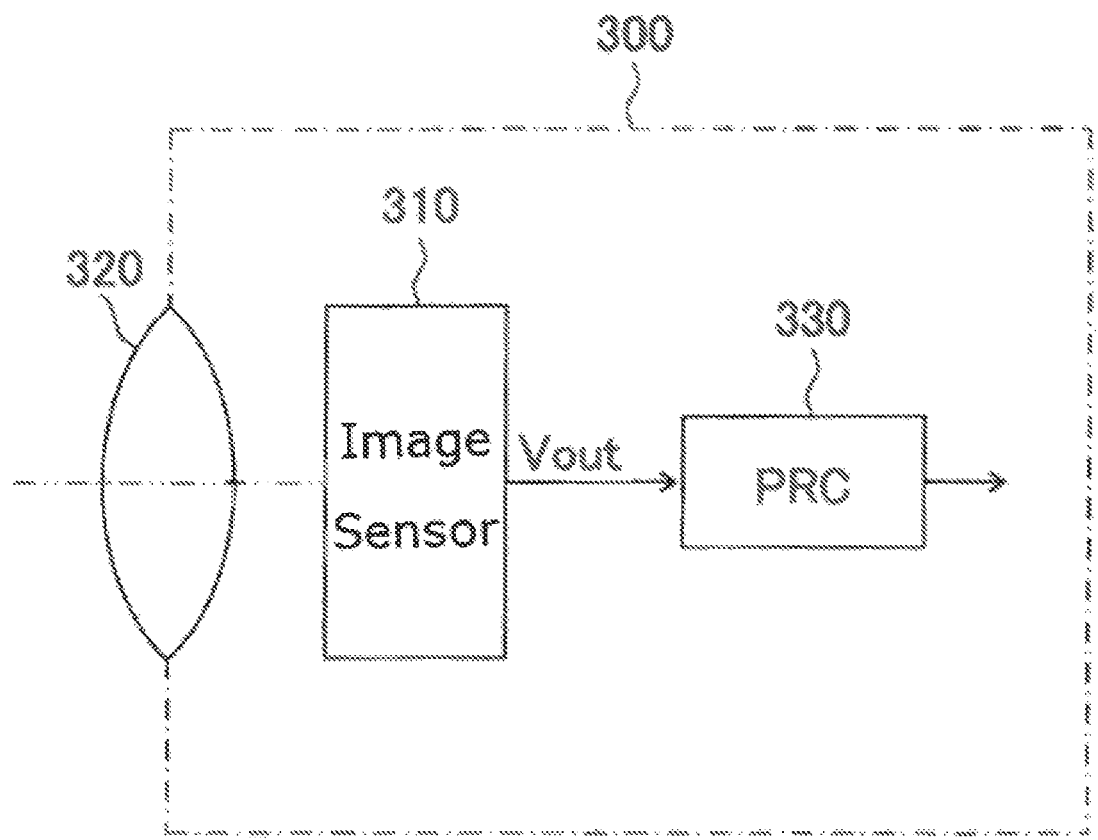
FIG. 18 shows an example of the configuration of an electronic apparatus to which the solid-state imaging device according to the embodiments of the present invention is applied.

FIG. 18 shows an example configuration of an electronic apparatus including a camera system to which the solid-state imaging device according to the embodiments of the present invention is applied.

As shown in FIG. 18, the electronic apparatus 300 includes a CMOS image sensor 310 that can be constituted by the solid-state imaging device 10 according to the embodiments of the present invention. Further, the electronic apparatus 300 includes an optical system (such as a lens) 320 for redirecting the incident light to pixel regions of the CMOS image sensor 310 (to form a subject image). The electronic apparatus 300 includes a signal processing circuit (PRC) 330 for processing output signals of the CMOS image sensor 310.

The signal processing circuit 330 performs predetermined signal processing on the output signals of the CMOS image sensor 310. The image signals processed in the signal processing circuit 330 can be handled in various manners. For example, the image signals can be displayed as a video image on a monitor having a liquid crystal display, or the image signals can be printed by a printer or recorded directly on a storage medium such as a memory card.

As described above, a high-performance, compact, and low-cost camera system can be provided that includes the solid-state imaging device 10 as the CMOS image sensor 310. Further, it is possible to produce electronic apparatuses such as surveillance cameras and medical endoscope cameras that are used for applications where cameras are required to be installed under restricted conditions such as the installation size, number of connectable cables, cable length, and installation height.

What is claimed is:

1. A solid-state imaging device comprising:
   a substrate having a first substrate surface side and a second substrate surface side opposed to the first substrate surface side;
   a photoelectric conversion part including a first conductivity type semiconductor layer pinned between the first substrate surface side and the second substrate surface side of the substrate, the photoelectric conversion part being configured to perform photoelectric conversion of received light and store charges;
   a second conductivity type semiconductor layer formed at least on a side portion of the first conductivity type semiconductor layer of the photoelectric conversion part;
   a transfer transistor for transferring the charges stored in the photoelectric conversion part;
   a floating diffusion to which the charges are transferred through the transfer transistor;
   a storage transistor connected to the floating diffusion; and
   a storage capacitance element for storing the charges received from the floating diffusion via the storage transistor,
   wherein the storage capacitance element is formed on the second substrate surface side so as to spatially overlap with at least a part of the photoelectric conversion part in a direction perpendicular to a substrate surface;
   a first region having a first depth from the second substrate surface toward the first substrate surface in the direction perpendicular to the substrate surface; and
   a second region having a second depth larger than the first depth,
   wherein the photoelectric conversion part is formed such that an area of a portion of a first conductivity type semiconductor layer in the second region opposed to the substrate surface is larger than an area of a portion of a first conductivity type semiconductor layer in the first region opposed to the substrate surface, and
   wherein the first conductivity type semiconductor layer in the second region has a shape that is wider at the first conductivity type semiconductor layer in the first region and narrower at the storage capacitance element in a direction parallel to the substrate surface.

2. The solid-state imaging device according to claim 1, wherein the storage capacitance element includes:
   a first electrode including a first conductivity type semiconductor region formed in a surface of a second substrate surface of the substrate; and
   a second electrode formed above the second substrate surface so as to be opposed at a distance to the first electrode in the direction perpendicular to the substrate surface.

3. The solid-state imaging device according to claim 2, wherein the first electrode of the storage capacitance element is formed as the first conductivity type semiconductor region in the surface of the second substrate surface of the substrate, so as to be opposed to the first conductivity type semiconductor layer of the photoelectric conversion part in the second region, with a second conductivity type semiconductor layer in the first region interposed therebetween.

4. The solid-state imaging device according to claim 3, wherein the first conductivity type semiconductor layer in the first region is offset from a center of a pixel.

5. The solid-state imaging device according to claim 3, wherein a second conductivity type epitaxial region is left in a region for forming the first conductivity type semiconductor layer in the second region.

6. The solid-state imaging device according to claim 3, wherein the first conductivity type semiconductor layer in the second region has such a shape that charges are transferred to the first conductivity type semiconductor layer in the first region.

7. The solid-state imaging device according to claim 3, wherein a second conductivity type semiconductor region is formed in a part of the first conductivity type semiconductor layer in the first region.

8. The solid-state imaging device according to claim 3, wherein a second conductivity type semiconductor region is formed in a part of the first conductivity type semiconductor layer in the second region.

9. The solid-state imaging device according to claim 3, wherein in the first conductivity type semiconductor layer in the second region, a region on the first substrate surface side is smaller than a region contacting with the first conductivity type semiconductor layer in the first region.

10. The solid-state imaging device according to claim 3, wherein a second conductivity type semiconductor layer is formed on a surface of the first conductivity type semiconductor layer of the photoelectric conversion part in the first region, the surface being disposed on the second substrate surface side,
wherein the floating diffusion is formed as a first conductivity type semiconductor region in the surface of the second substrate surface of the substrate,
wherein a capacitance connection node between the storage transistor and the storage capacitance element is formed as a first conductivity type semiconductor region in the surface of the second substrate surface of the substrate,
wherein the transfer transistor includes a gate electrode disposed above the second substrate surface of the substrate between the second conductivity type semiconductor region and the first conductivity type semiconductor region as the floating diffusion, and
wherein the storage transistor includes a gate electrode disposed above the second substrate surface of the substrate between the first conductivity type semiconductor region as the floating diffusion and the first conductivity type semiconductor region as the capacitance connection node.

11. The solid-state imaging device according to claim 10, wherein a first conductivity type semiconductor region is formed on the second substrate surface side under the gate electrode of the storage transistor so as to connect to the first conductivity type semiconductor region as the capacitance connection node.

12. The solid-state imaging device according to claim 10, wherein the floating diffusion is shared by a plurality of photoelectric conversion parts and a plurality of transfer transistors so as to form a shared pixel design, and
wherein a first conductivity type semiconductor region is formed on the second substrate surface side under the gate electrode of the storage transistor so as to connect to the first conductivity type semiconductor region as the capacitance connection node.

13. The solid-state imaging device according to claim 10, further comprising:
a reset transistor for resetting at least the floating diffusion to a predetermined potential,
wherein a connection node connecting the reset transistor to the floating diffusion or the storage capacitance element is formed as a first conductivity type semiconductor region in the surface of the second substrate surface of the substrate,
wherein a power supply connection node connecting the reset transistor to the predetermined potential is formed as a first conductivity type semiconductor region in the surface of the second substrate surface of the substrate,
wherein the reset transistor includes a gate electrode disposed above the second substrate surface of the substrate between the first conductivity type semiconductor region as the connection node and the first conductivity type semiconductor region as the power supply connection node, and
wherein a first conductivity type semiconductor region is formed on the second substrate surface side under the gate electrode of the reset transistor so as to connect to the first conductivity type semiconductor region as the power supply connection node.

14. The solid-state imaging device according to claim 10, wherein a second conductivity type semiconductor region for device isolation is formed in at least a surface portion on the second substrate surface side between the first conductivity type semiconductor region as the first electrode of the storage capacitance element and the first conductivity type semiconductor region as the capacitance connection node of the storage transistor.

15. The solid-state imaging device according to claim 10, wherein a second conductivity type semiconductor region for device isolation is formed in at least a surface portion on the second substrate surface side between the first conductivity type semiconductor region as the first electrode of the storage capacitance element and the first conductivity type semiconductor region as the floating diffusion.

16. The solid-state imaging device according to claim 10, wherein a second conductivity type semiconductor region is formed between the first conductivity type semiconductor region as the floating diffusion and the second conductivity type semiconductor region for device isolation.

17. The solid-state imaging device according to claim 10, wherein a second conductivity type semiconductor region is formed in a region disposed between the first conductivity type semiconductor region as the floating diffusion and the first conductivity type semiconductor region as the capacitance connection node and deeper from the surface of the second substrate surface than these first conductivity type semiconductor regions.

18. The solid-state imaging device according to claim 10, wherein a ring part for limiting an active region surrounds at least one of the first conductivity type semiconductor region as the floating diffusion and the first conductivity type semiconductor region as the capacitance connection node.

19. The solid-state imaging device according to claim 10, further comprising:
a reset transistor for resetting at least the floating diffusion to a predetermined potential, wherein a gate electrode of the reset transistor is surrounded by a ring part for limiting a first conductivity type semiconductor region as a connection node.

20. The solid-state imaging device according to claim 10, wherein an overflow path is formed in a region deeper from the surface of the second substrate surface than the transfer transistor, the floating diffusion, the storage transistor, and the capacitance connection node between the storage transistor and the storage capacitance element.

21. The solid-state imaging device according to claim 20, wherein the overflow path is formed as a first conductivity type embedded layer positioned in a region deeper from the surface of the second substrate surface than a second conductivity type semiconductor region as a channel formation region for the transfer transistor, the first conductivity type semiconductor region as the floating diffusion, a second conductivity type semiconductor region as a channel formation region for the storage transistor, and the first conductivity type semiconductor region as the capacitance connection node, each formed in the surface of the second substrate surface.

22. The solid-state imaging device according to claim 1, wherein the solid-state imaging device is of a backside illumination type.

23. A method for fabricating a solid-state imaging device, comprising the steps of:
   forming, in a substrate having a first substrate surface side and a second substrate surface side opposed to the first substrate surface side, a photoelectric conversion part including a first conductivity type semiconductor layer pinned between the first substrate surface side and the second substrate surface side, the photoelectric conversion part being configured to perform photoelectric conversion of received light and store charges;
   forming a second conductivity type semiconductor layer at least on a side portion of the first conductivity type semiconductor layer of the photoelectric conversion part;
   forming a transfer transistor for transferring the charges stored in the photoelectric conversion part;
   forming a floating diffusion to which the charges are transferred through the transfer transistor;
   forming a storage transistor connected to the floating diffusion; and
   forming a storage capacitance element for storing the charges received from the floating diffusion via the storage transistor,
   wherein forming the storage capacitance element includes forming the storage capacitance element on the second substrate surface side so as to spatially overlap with at least a part of the photoelectric conversion part in a direction perpendicular to a substrate surface;
   forming a first region having a first depth from the second substrate surface toward the first substrate surface in the direction perpendicular to the substrate surface; and
   forming a second region having a second depth larger than the first depth,
   wherein forming the photoelectric conversion part includes forming such that an area of a portion of a first conductivity type semiconductor layer in the second region opposed to the substrate surface is larger than an area of a portion of a first conductivity type semiconductor layer in the first region opposed to the substrate surface, and
   wherein the first conductivity type semiconductor layer in the second region has a shape that is wider at the first conductivity type semiconductor layer in the first region and narrower at the storage capacitance element in a direction parallel to the substrate surface.

24. An electronic apparatus, comprising:
   a solid-state imaging device; and
   an optical system for forming a subject image on the solid-state imaging device,
   wherein the solid-state imaging device includes:
   a substrate having a first substrate surface side and a second substrate surface side opposed to the first substrate surface side;
   a photoelectric conversion part including a first conductivity type semiconductor layer pinned between the first substrate surface side and the second substrate surface side of the substrate, the photoelectric conversion part being configured to perform photoelectric conversion of received light and store charges;
   a second conductivity type semiconductor layer formed at least on a side portion of the first conductivity type semiconductor layer of the photoelectric conversion part;
   a transfer transistor for transferring the charges stored in the photoelectric conversion part;
   a floating diffusion to which the charges are transferred through the transfer transistor;
   a storage transistor connected to the floating diffusion; and
   a storage capacitance element for storing the charges received from the floating diffusion via the storage transistor, and
   wherein the storage capacitance element is formed on the second substrate surface side so as to spatially overlap with at least a part of the photoelectric conversion part in a direction perpendicular to a substrate surface;
   a first region having a first depth from the second substrate surface toward the first substrate surface in the direction perpendicular to the substrate surface; and
   a second region having a second depth larger than the first depth,
   wherein the photoelectric conversion part is formed such that an area of a portion of a first conductivity type semiconductor layer in the second region opposed to the substrate surface is larger than an area of a portion of a first conductivity type semiconductor layer in the first region opposed to the substrate surface, and
   wherein the first conductivity type semiconductor layer in the second region has a shape that is wider at the first conductivity type semiconductor layer in the first region and narrower at the storage capacitance element in a direction parallel to the substrate surface.

* * * * *